(12) United States Patent
Sukekawa et al.

(10) Patent No.: US 11,217,588 B2
(45) Date of Patent: Jan. 4, 2022

(54) INTEGRATED ASSEMBLIES COMPRISING VOIDS BETWEEN ACTIVE REGIONS AND CONDUCTIVE SHIELD PLATES, AND METHODS OF FORMING INTEGRATED ASSEMBLIES

(71) Applicant: Micron Technology, Inc., Boise, ID (US)

(72) Inventors: Mitsunari Sukekawa, Hiroshima (JP); Hiroaki Taketani, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 32 days.

(21) Appl. No.: 16/502,584

(22) Filed: Jul. 3, 2019

(65) Prior Publication Data

US 2021/0005611 A1 Jan. 7, 2021

(51) Int. Cl.
*H01L 27/108* (2006.01)
*H01L 21/768* (2006.01)
(Continued)

(52) U.S. Cl.
CPC .. *H01L 27/10814* (2013.01); *H01L 21/31111* (2013.01); *H01L 21/764* (2013.01);
(Continued)

(58) Field of Classification Search
CPC ......... H01L 27/10832; H01L 27/10835; H01L 27/10838; H01L 27/10841; H01L 27/10861–1087; H01L 27/10829–10841; H01L 27/108–10826; H01L 27/10844–10858; H01L 27/10873–10897; H01L 27/1023; H01L 2924/1436–14369; H01L 27/10814; H01L 21/76877; H01L 29/0847; H01L 29/1037; H01L 29/66666; H01L 29/402; H01L 27/10891; H01L 27/10885; H01L 27/10852; H01L 21/764; H01L 21/76802; H01L 21/76831; H01L 28/60;
(Continued)

(56) References Cited

U.S. PATENT DOCUMENTS 8,829,583 B2 * 9/2014 Taketani ........... H01L 27/10829
257/296
2008/0283816 A1 * 11/2008 Takaishi .................. H01L 27/24
257/4
(Continued)

*Primary Examiner* — Jonathan Han
(74) *Attorney, Agent, or Firm* — Wells St. John P.S.

(57) ABSTRACT

Some embodiments include integrated memory having a wordline, a shield plate, and an access device. The access device includes first and second diffusion regions, and a channel region. The channel region is vertically disposed between the first and second diffusion regions. The access device is adjacent to the wordline and to the shield plate. A part of the wordline is proximate a first side surface of the channel region with an intervention of a first insulating region therebetween. A part of the shield plate is proximate a second side surface of the channel region with an intervention of a second insulating region therebetween. The first insulating region includes an insulative material. The second insulating region includes a void. Some embodiments include memory arrays. Some embodiments include methods of forming integrated assemblies.

29 Claims, 19 Drawing Sheets

(51) Int. Cl.

| | |
|---|---|
| *H01L 21/311* | (2006.01) |
| *H01L 29/08* | (2006.01) |
| *H01L 29/10* | (2006.01) |
| *H01L 29/66* | (2006.01) |
| *H01L 29/40* | (2006.01) |
| *H01L 21/764* | (2006.01) |
| *H01L 49/02* | (2006.01) |
| *H01L 29/78* | (2006.01) |
| *H01L 23/528* | (2006.01) |

(52) U.S. Cl.
CPC .. *H01L 21/76802* (2013.01); *H01L 21/76831* (2013.01); *H01L 21/76877* (2013.01); *H01L 23/528* (2013.01); *H01L 27/10852* (2013.01); *H01L 27/10873* (2013.01); *H01L 27/10885* (2013.01); *H01L 27/10891* (2013.01); *H01L 28/60* (2013.01); *H01L 29/0847* (2013.01); *H01L 29/1037* (2013.01); *H01L 29/402* (2013.01); *H01L 29/66666* (2013.01); *H01L 29/7827* (2013.01)

(58) Field of Classification Search
CPC ........... H01L 21/31111; H01L 29/7827; H01L 23/528; H01L 27/10811; H01L 27/10805; H01L 21/76232
See application file for complete search history.

(56) References Cited

U.S. PATENT DOCUMENTS

| | | | |
|---|---|---|---|
| 2010/0237396 A1* | 9/2010 | Kennedy | ........... H01L 27/10852 |
| | | | 257/306 |
| 2014/0361403 A1* | 12/2014 | Cho | ...................... H01L 21/764 |
| | | | 257/532 |

* cited by examiner

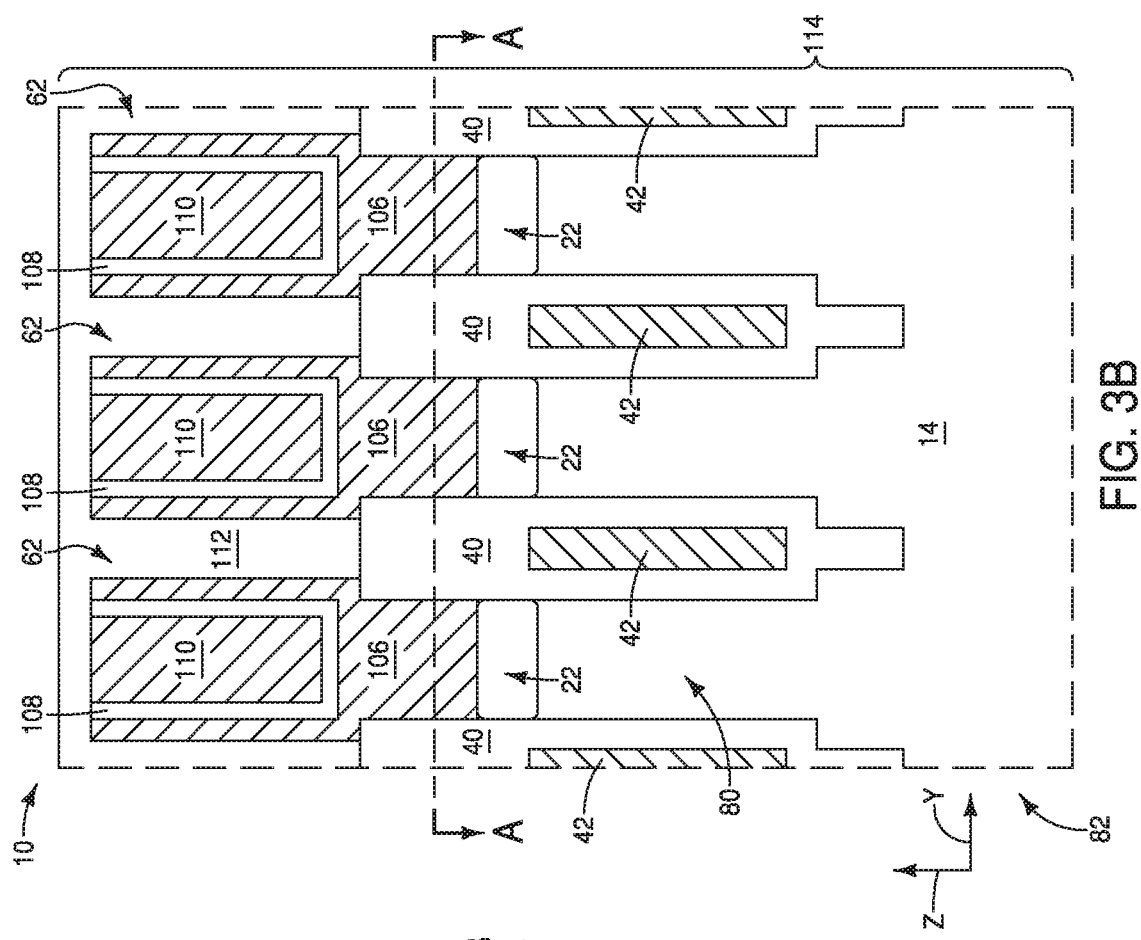
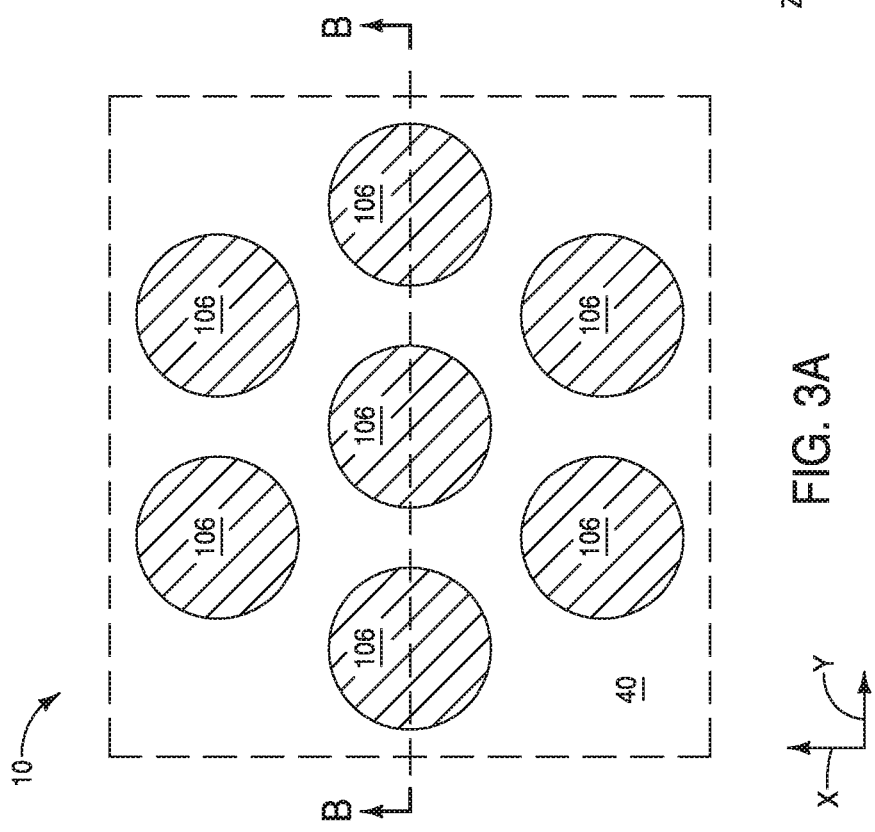
FIG. 3B
FIG. 3A

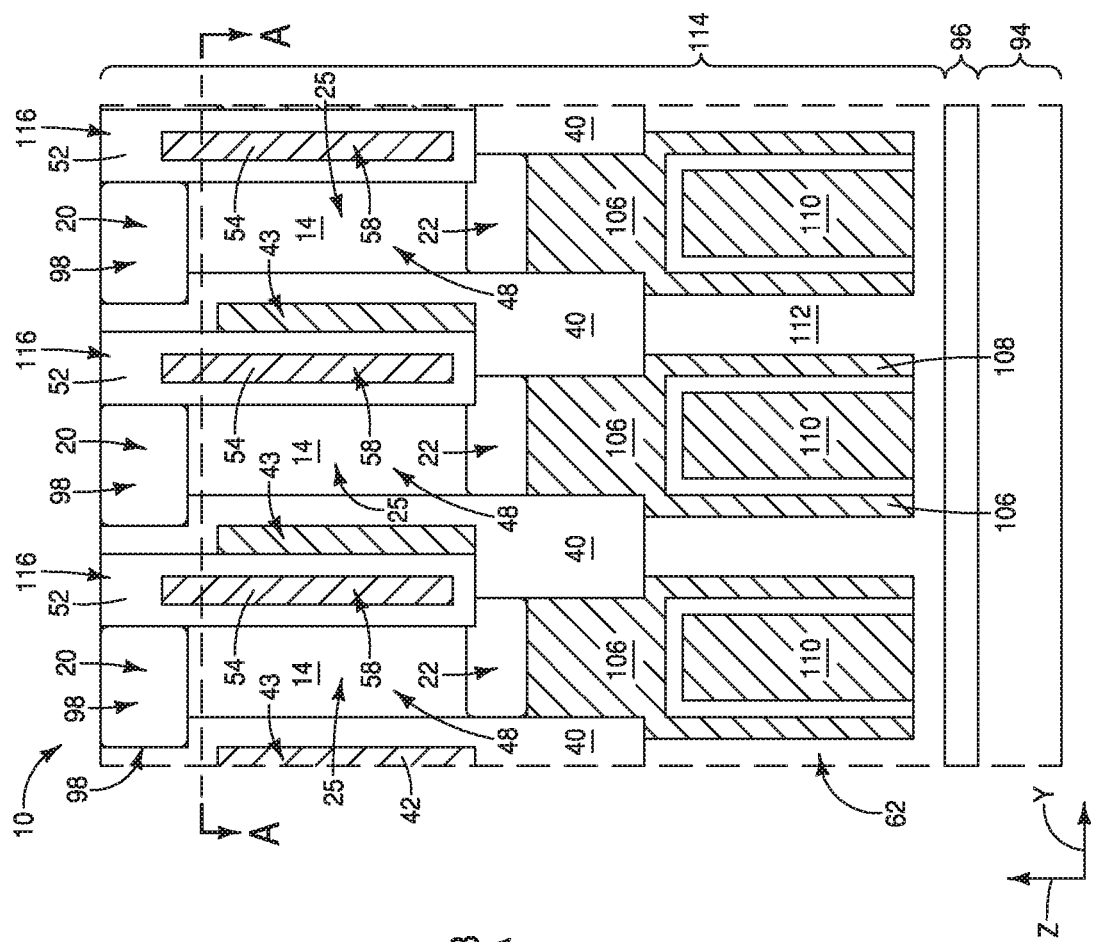
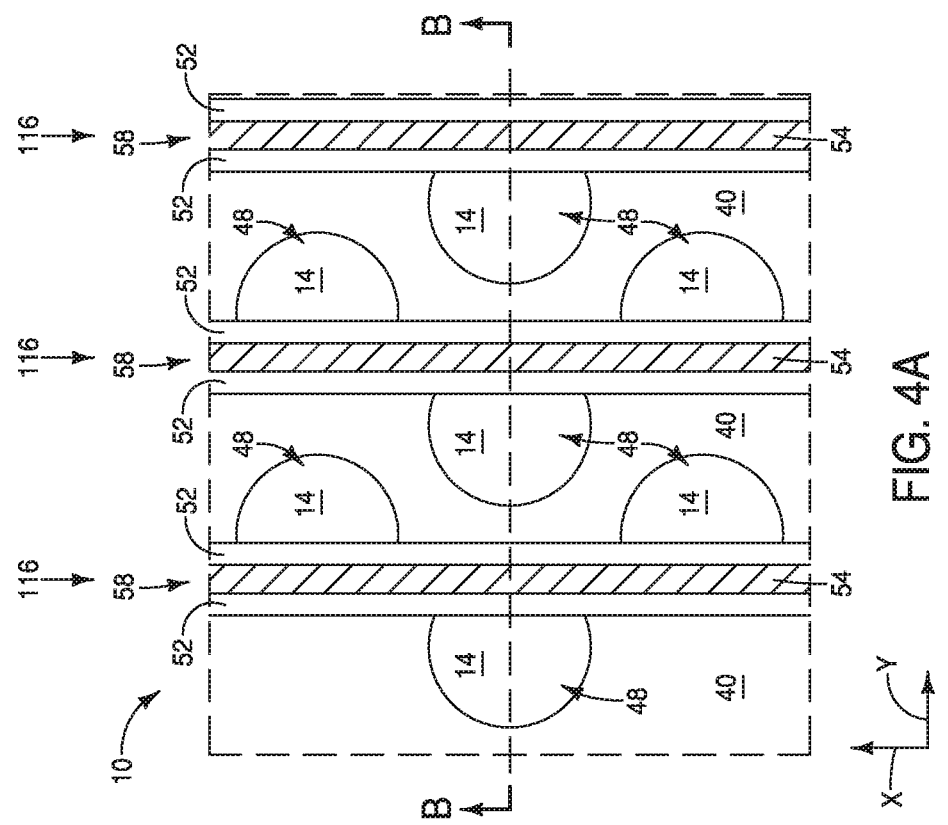
FIG. 4A
FIG. 4B

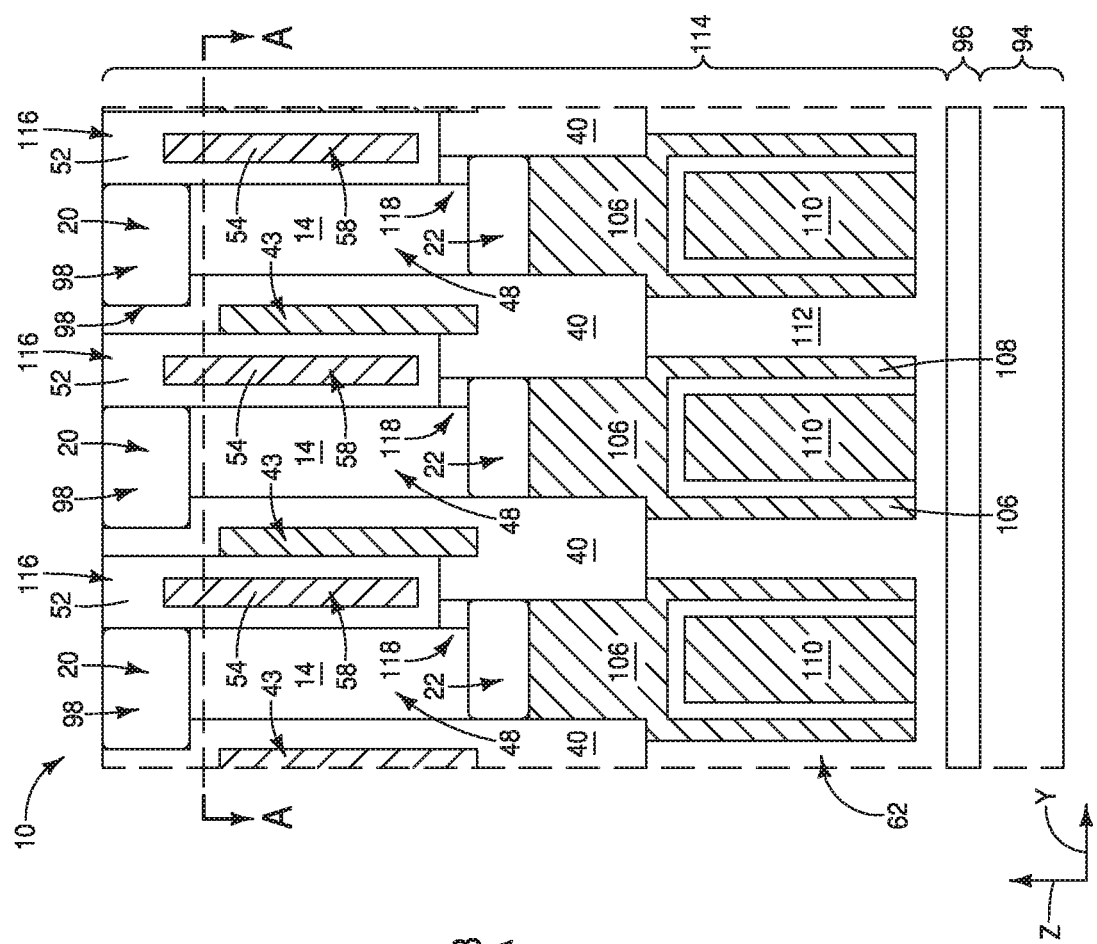
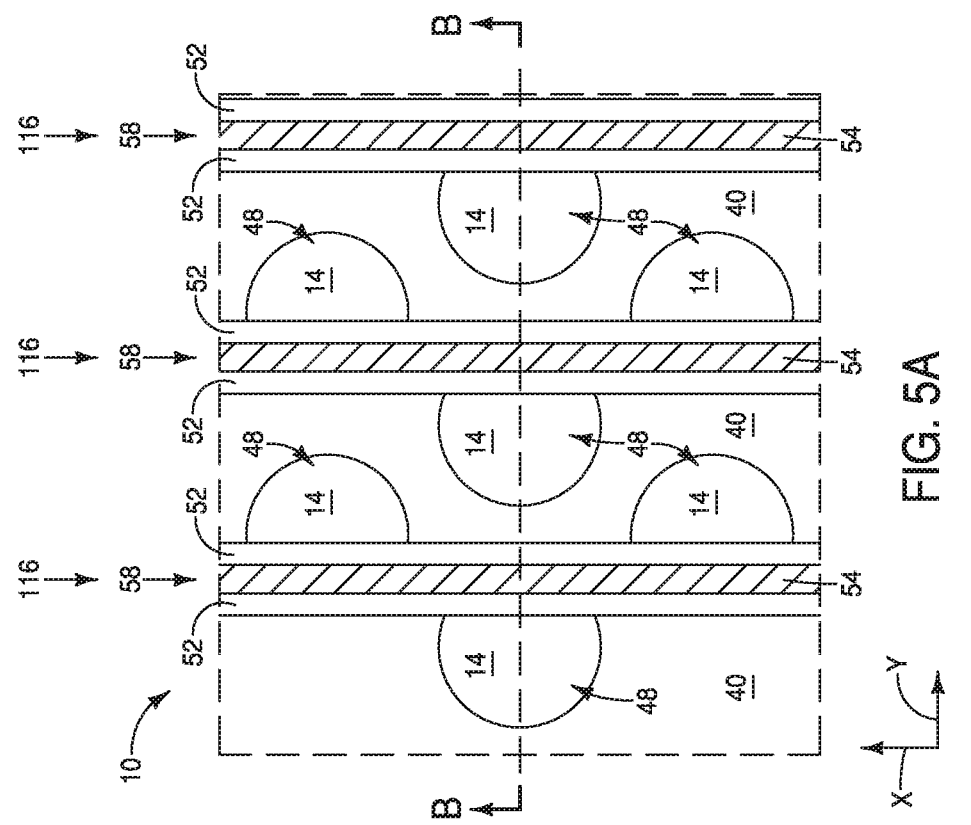
FIG. 5B
FIG. 5A

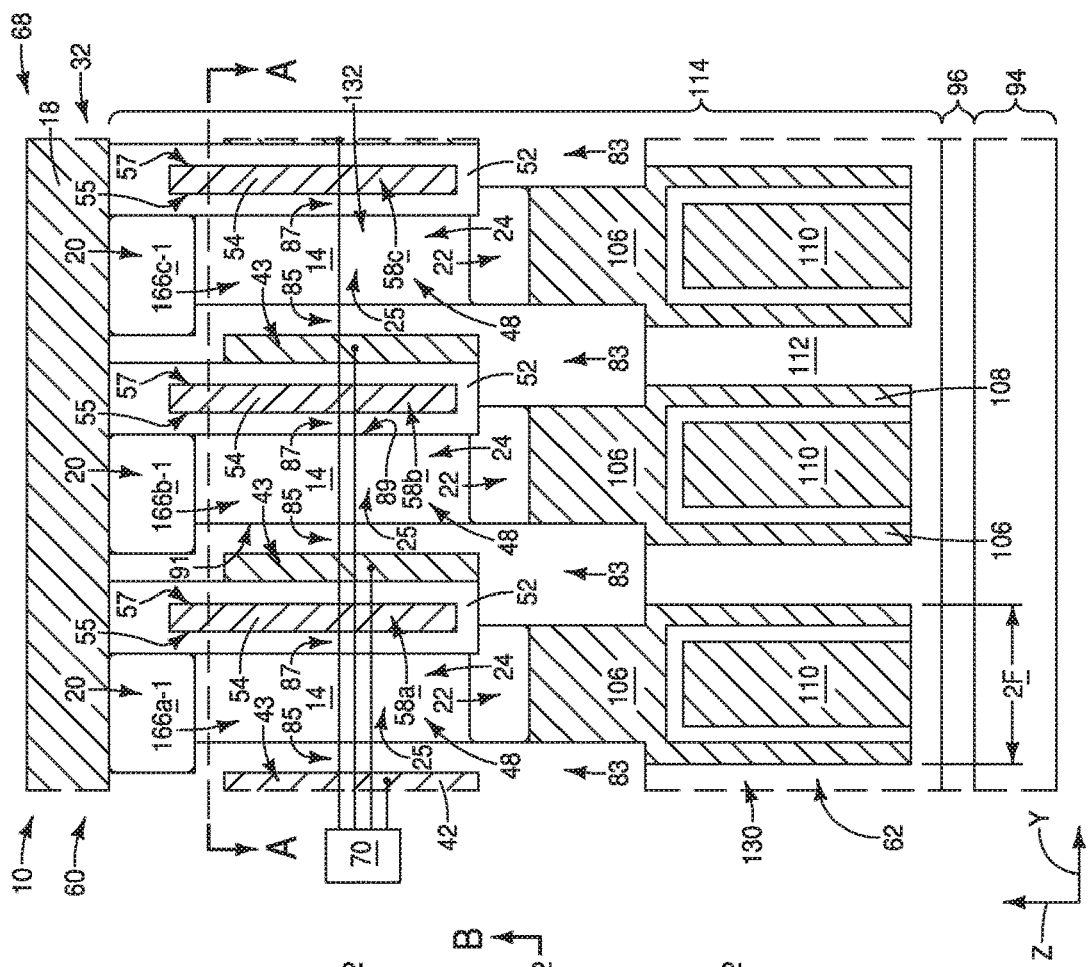
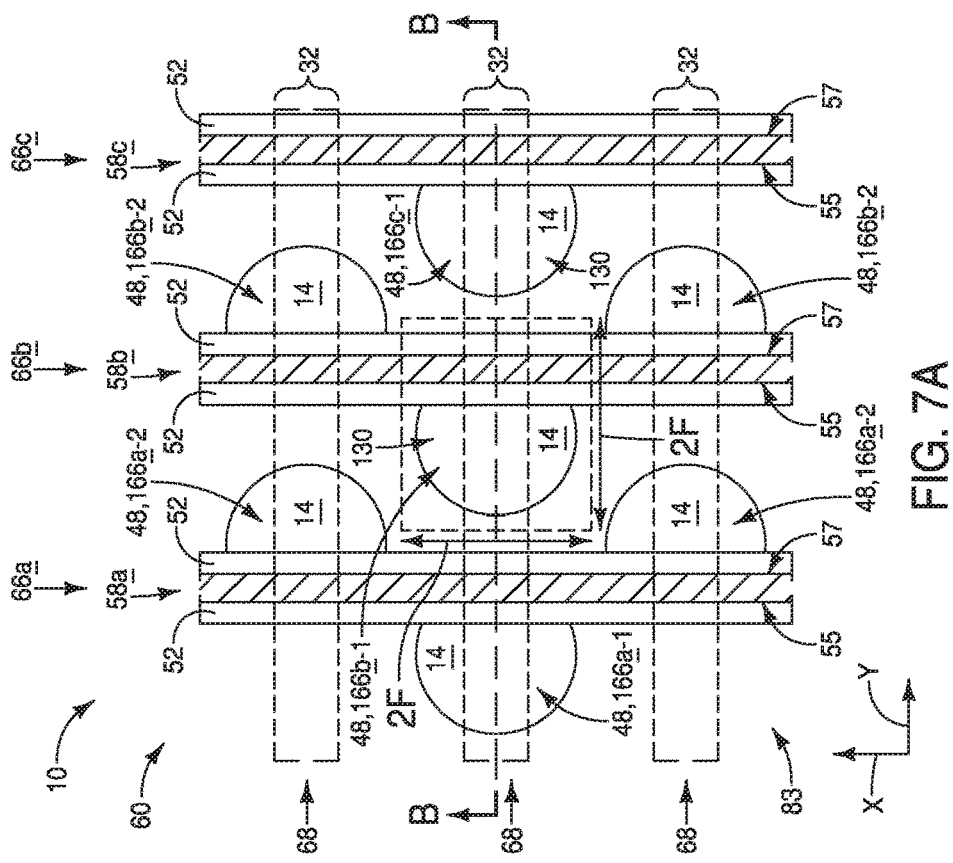
FIG. 7B
FIG. 7A

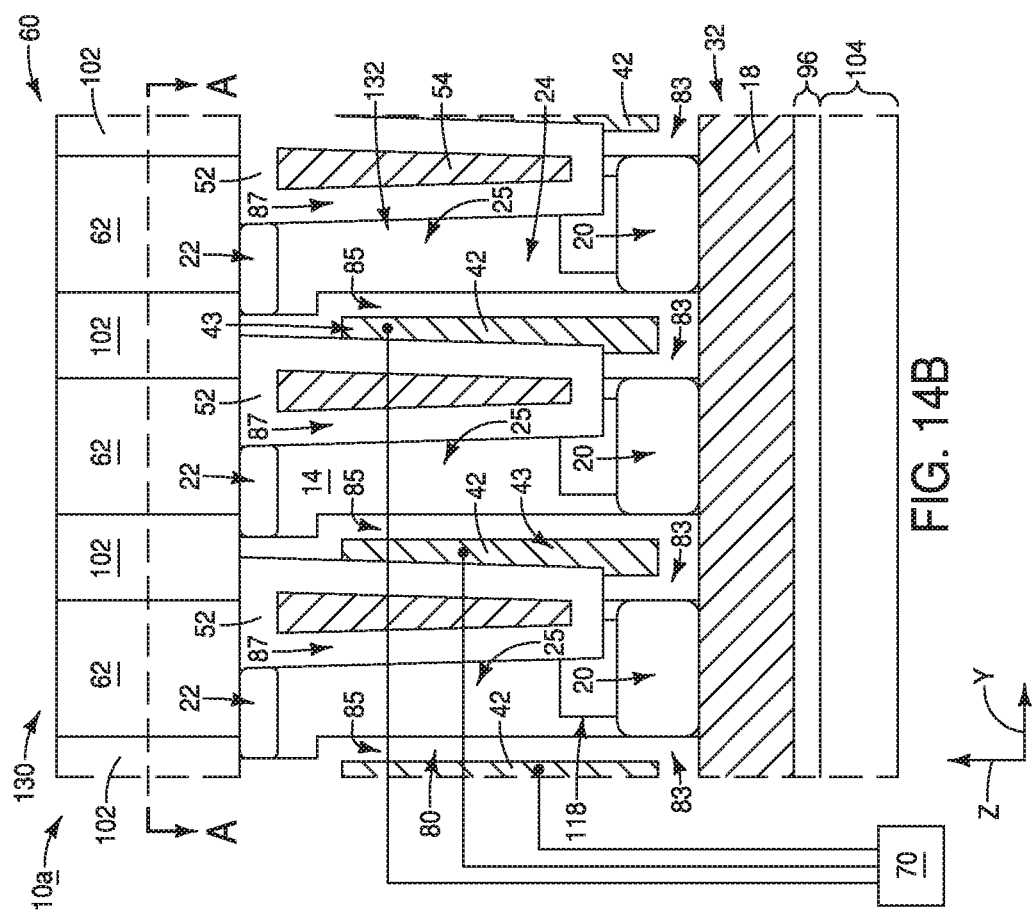
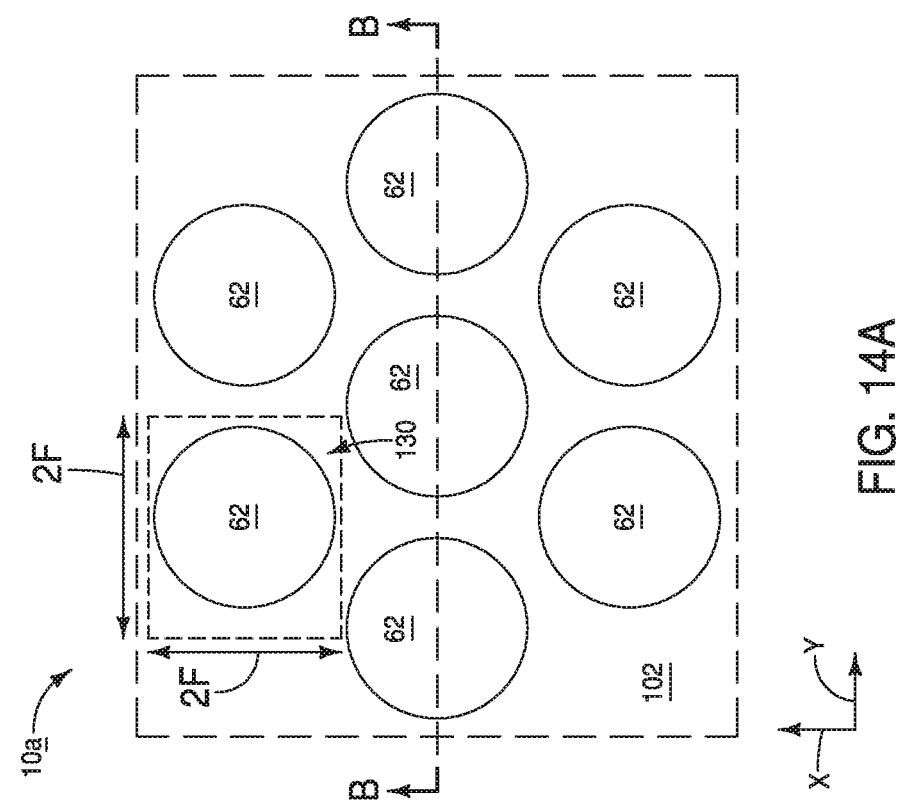
FIG. 14B
FIG. 14A

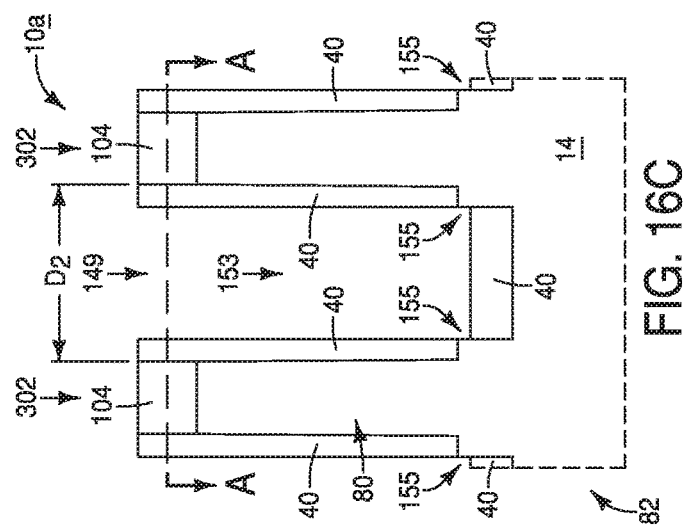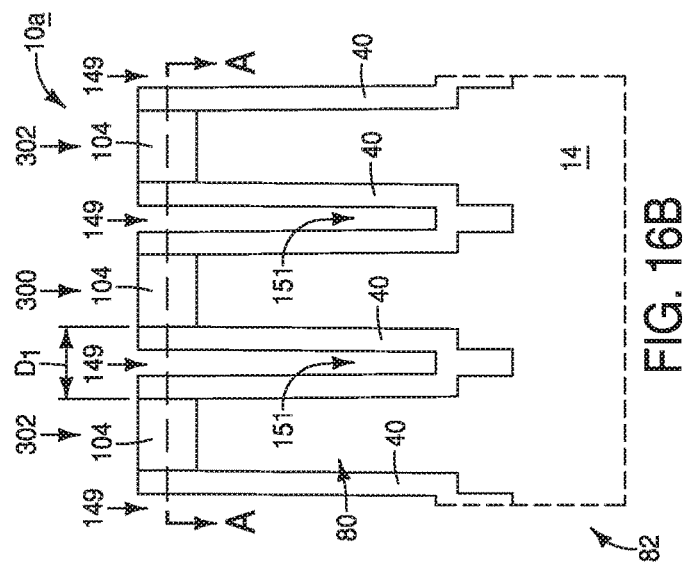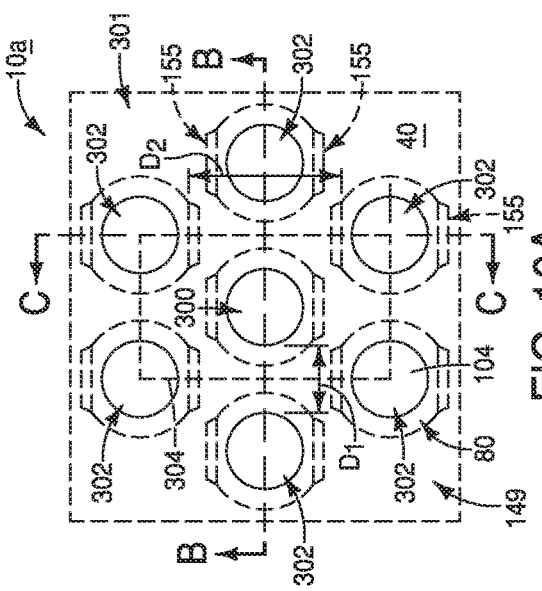

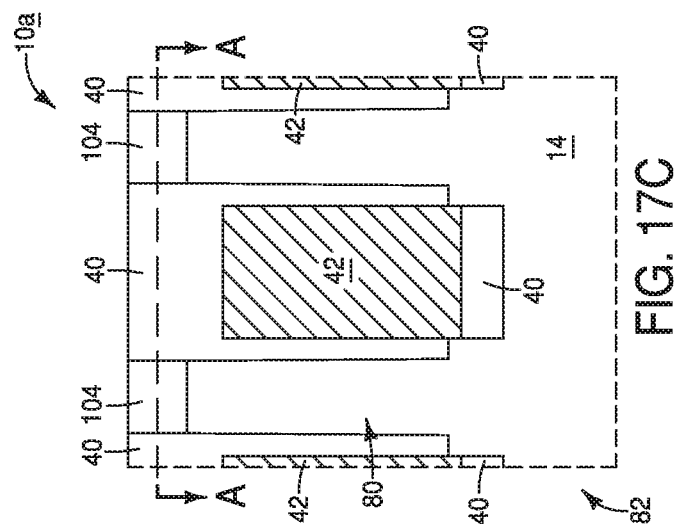
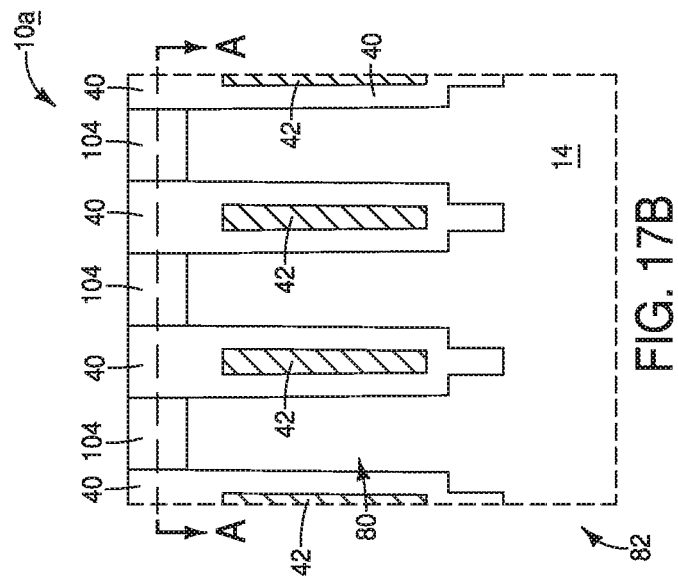
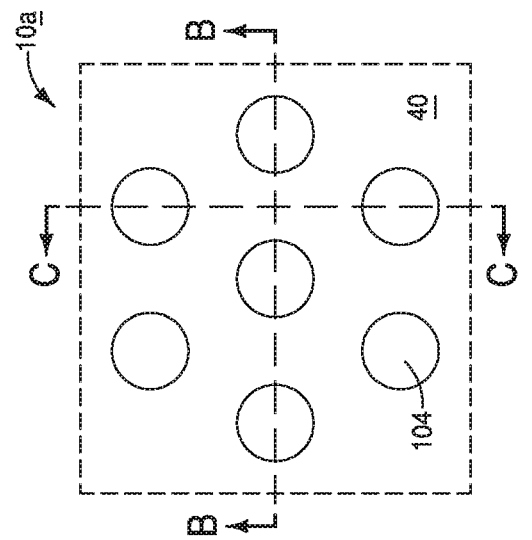

11,217,588 B2

INTEGRATED ASSEMBLIES COMPRISING VOIDS BETWEEN ACTIVE REGIONS AND CONDUCTIVE SHIELD PLATES, AND METHODS OF FORMING INTEGRATED ASSEMBLIES

TECHNICAL FIELD

Integrated assemblies, such as, for example, memory arrays. Integrated assemblies comprising voids between active regions and conductive shield plates. Methods of forming integrated assemblies

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which each have one capacitor in combination with one transistor (so-called 1T-1C memory cells), with the capacitor being coupled with a source/drain region of the transistor. The DRAM cells may be utilized in a DRAM array having hundreds, thousands, millions, etc., of memory cells. The transistors of the memory array have gates coupled with wordlines (i.e., access lines). The memory cells of the memory array are addressed utilizing bitlines (i.e., digit lines, sense lines) in combination with the wordlines.

A continuing goal of integrated circuit fabrication is to scale integrated circuitry to ever-increasing levels of integration. It would be desirable to develop memory arrangements suitable for scaling into highly-integrated configurations.

BRIEF DESCRIPTION OF THE DRAWINGS

FIGS. 3A and 3B are a diagrammatic cross-sectional top-down view and a diagrammatic cross-sectional side view, respectively, of the example assembly of FIGS. 1A and 1B at an example process stage following that of FIGS. 2A and 2B. The view of FIG. 3A is along the line A-A of FIG. 3B, and the view of FIG. 3B is along the line B-B of FIG. 3A.

FIGS. 4A and 4B are a diagrammatic cross-sectional top-down view and a diagrammatic cross-sectional side view, respectively, of the example assembly of FIGS. 1A and 1B at an example process stage following that of FIGS. 3A and 3B. The view of FIG. 4A is along the line A-A of FIG. 4B, and the view of FIG. 4B is along the line B-B of FIG. 4A.

FIGS. 5A and 5B are a diagrammatic cross-sectional top-down view and a diagrammatic cross-sectional side view, respectively, of the example assembly of FIGS. 1A and 1B at an example process stage following that of FIGS. 3A and 3B, and alternative to that of FIGS. 4A and 4B. The view of FIG. 5A is along the line A-A of FIG. 5B, and the view of FIG. 5B is along the line B-B of FIG. 5A.

FIGS. 7A and 7B are a diagrammatic cross-sectional top-down view and a diagrammatic cross-sectional side view, respectively, of a region of the example assembly of FIGS. 1A and 1B at an example process stage following that of FIGS. 6A and 6B. The view of FIG. 7A is along the line A-A of FIG. 7B, and the view of FIG. 7B is along the line B-B of FIG. 7A.

FIGS. 14A and 14B are a diagrammatic cross-sectional top-down view and a diagrammatic cross-sectional side view, respectively, of the example assembly of FIGS. 8A and 8B at an example process stage following that of FIGS. 13A and 13B. The view of FIG. 14A is along the line A-A of FIG. 14B, and the view of FIG. 14B is along the line B-B of FIG. 14A.

FIGS. 16A, 16B and 16C are a diagrammatic cross-sectional top-down view (FIG. 16A) and diagrammatic cross-sectional side views (FIGS. 16B and 16C) of an example assembly at an example process stage of an example method for fabricating an example array of memory cells. The process stage of FIGS. 16A, 16B and 16C may follow the process of FIGS. 15A, 15B and 15C. The view of FIG. 16A is along the line A-A of FIGS. 16B and 16C; the view of FIG. 16B is along the line B-B of FIG. 16A; and the view of FIG. 16C is along the line C-C of FIG. 16A.

FIGS. 17A, 17B and 17C are a diagrammatic cross-sectional top-down view (FIG. 17A) and diagrammatic cross-sectional side views (FIGS. 17B and 17C) of an example assembly at an example process stage of an example method for fabricating an example array of memory cells. The process stage of FIGS. 17A, 17B and 17C may be utilized as an embodiment of the process shown in FIGS. 9A and 9B, and may follow the process stage of FIGS. 16A, 16B and 16C. The view of FIG. 17A is along the line A-A of FIGS. 17B and 17C; the view of FIG. 17B is along the line B-B of FIG. 17A; and the view of FIG. 17C is along the line C-C of FIG. 17A.

DETAILED DESCRIPTION OF THE ILLUSTRATED EMBODIMENTS

Some embodiments include integrated assemblies having shielding material between memory cells (e.g., DRAM cells). The shielding material may suppress interference between neighboring components. The memory cells may have vertically-extending channel regions. The shielding material may be spaced from such channel regions by voids, which may improve ON current along the channel regions as compared to configurations lacking the voids between the shielding material and the channel regions. Example embodiments are described with reference to FIGS. 1-19.

A first example method of forming a first example DRAM array is described with reference to FIGS. 1-7.

Figure 1B:
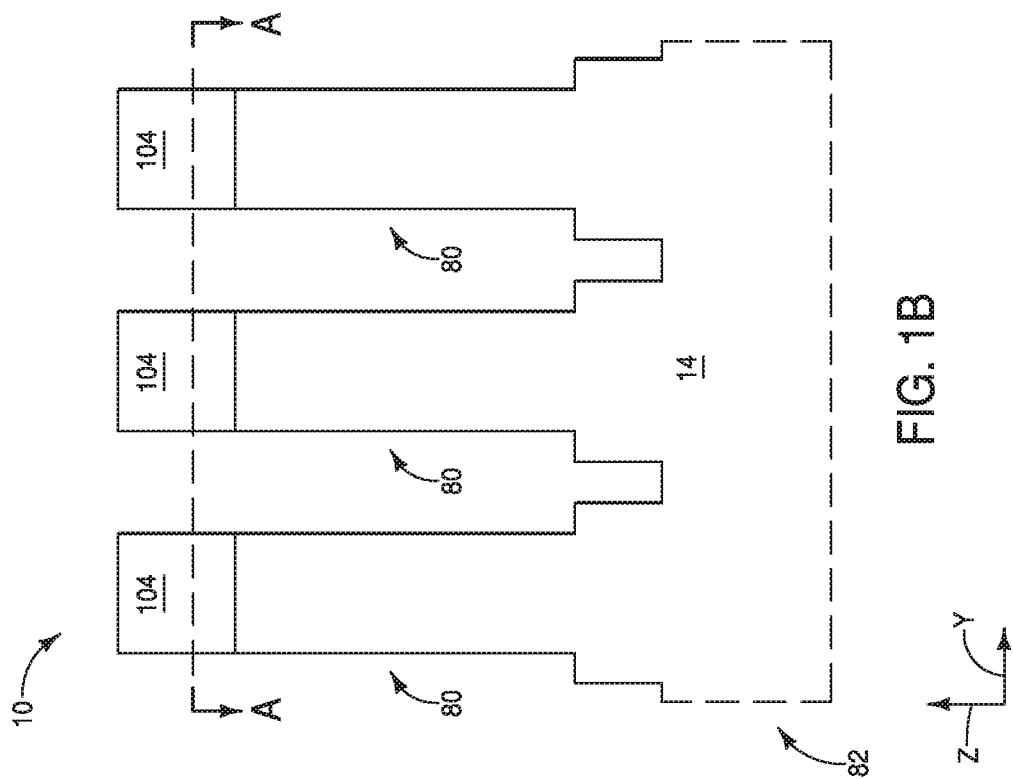
FIGS. 1A and 1B are a diagrammatic cross-sectional top-down view and a diagrammatic cross-sectional side view, respectively, of an example assembly at an example process stage of an example method for fabricating an example array of memory cells. The view of FIG. 1A is along the line A-A of FIG. 1B, and the view of FIG. 1B is along the line B-B of FIG. 1A.
Figure 1A:
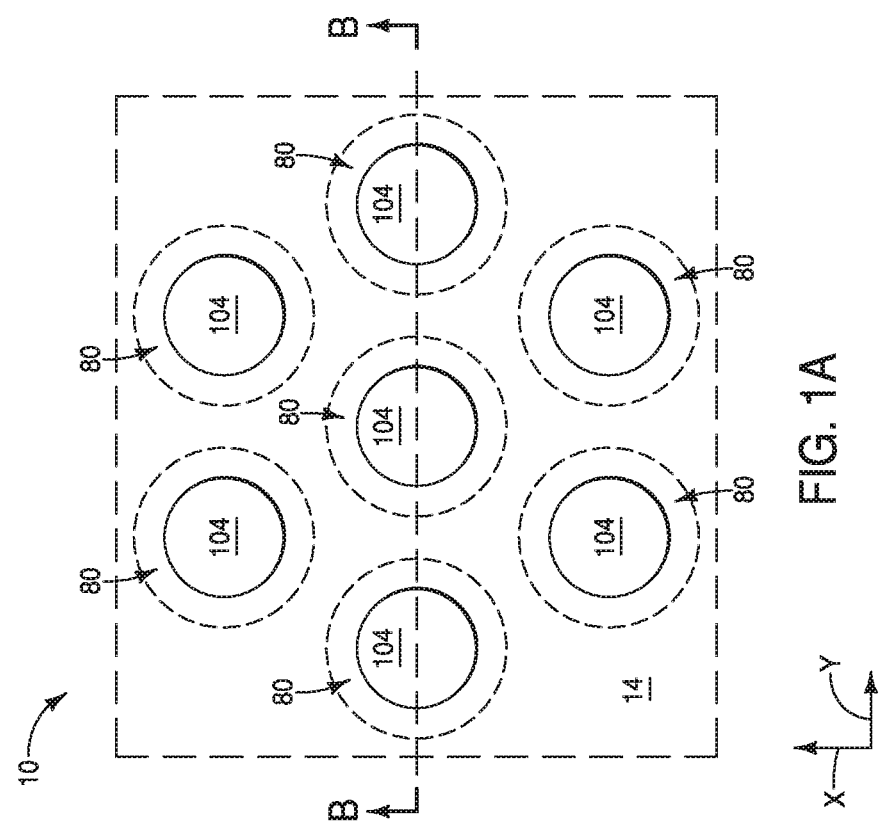

Referring to FIGS. 1A and 1B, a construction 10 comprises islands 80 of semiconductor material 14 extending upwardly from a mass 82 of the semiconductor material. The semiconductor material 14 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of monocrystalline silicon.

The islands are capped with protective material 104. The protective material 104 may comprise any suitable composition(s); and in some embodiments may comprise, consist essentially of, or consist of silicon nitride.

An x, y, z axis system is provided relative to FIGS. 1A and 1B to assist the reader in understanding the relationships of the structures shown in the figures. In some embodiments, the x-axis direction and y-axis direction may be referred to as first and second directions, respectively. In some embodiments, the islands 80 may be considered to be arranged in a matrix have rows and columns; and the x-axis direction and the y-axis direction may be considered to be a row direction and a column direction, respectively.

Figure 2B:
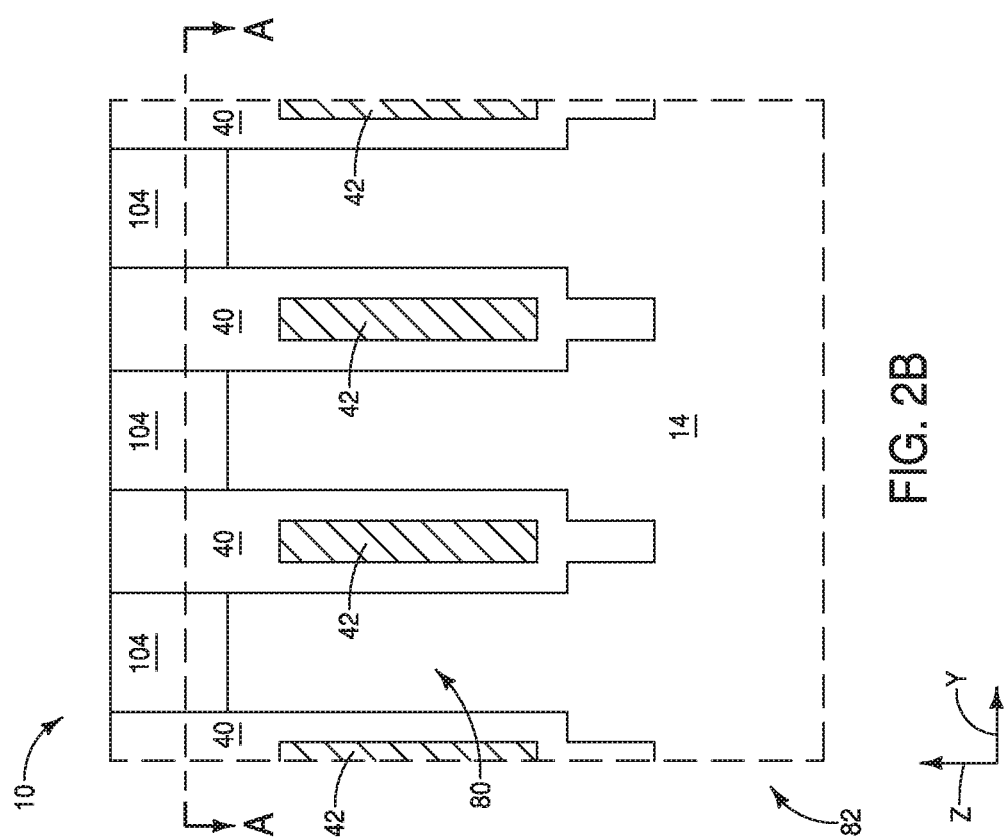
FIGS. 2A and 2B are a diagrammatic cross-sectional top-down view and a diagrammatic cross-sectional side view, respectively, of the example assembly of FIGS. 1A and 1B at an example process stage following that of FIGS. 1A and 1B. The view of FIG. 2A is along the line A-A of FIG. 2B, and the view of FIG. 2B is along the line B-B of FIG. 2A.
Figure 2A:
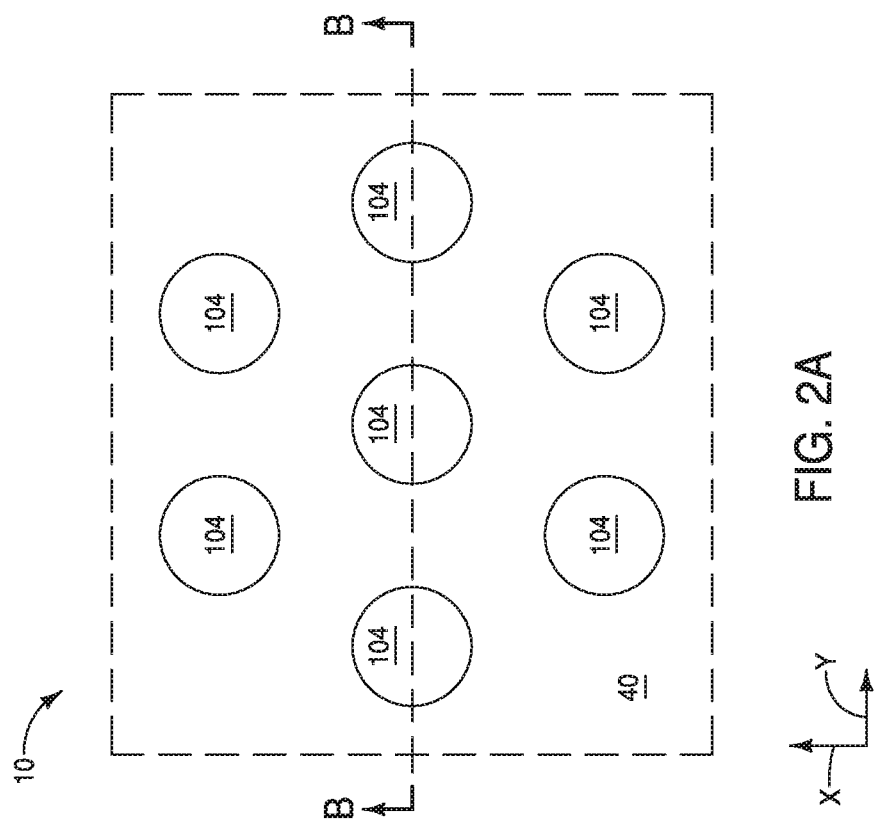

Referring to FIGS. 2A and 2B, regions between the islands 80 are lined with insulative material 40, then conductive shield material 42 is deposited and recessed, and then additional insulative material 40 is provided over the shield material.

The insulative material 40 may comprise any suitable composition(s); and in some embodiments may comprise, consist essentially of, or consist of silicon nitride. In some embodiments, the insulative material 40 may be referred to as a first insulative material.

The conductive shield material 42 may comprise any suitable composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive shield material 42 may comprise, consist essentially of, or consist of conductively-doped semiconductor material (e.g., conductively-doped polycrystalline silicon). The conductively-doped semiconductor material may be doped to any suitable concentration, and in some embodiments may be doped to a concentration of at least about $1 \times 10^{20}$ atoms/cm$^3$ with either n-type dopant (e.g., phosphorus) or p-type dopant (e.g., boron). In other words, in some example embodiments the shield material 42 may comprise polycrystalline semiconductor material (e.g., polycrystalline silicon) which is heavily-doped with one or more impurities (e.g., one or more of phosphorus, arsenic, boron, etc.).

In some embodiments the semiconductor material 14 and the shield material 42 may both comprise, consist essentially of, or consist of silicon; with the silicon of the semiconductor material 14 being monocrystalline, and with the silicon of the shield material 42 being polycrystalline (and in some applications, being referred to as polysilicon).

Referring to FIGS. 3A and 3B, the protective material 104 (FIGS. 2A and 2B) is removed, and then doped regions 22 are formed along upper portions of the islands 80. In the shown embodiment, the doped regions 22 are formed after removing the protective material 104. In other embodiments, the semiconductor material 14 may be blanket-doped prior to patterning the material into the islands 80, and accordingly the doped regions 22 may be formed at an earlier process stage than the process stage of FIGS. 3A and 3B. The doped regions 22 correspond to source/drain regions.

Capacitors 62 are formed to be coupled with (electrically connected with) the source/drain regions 22. The illustrated capacitors are container-type capacitors; and each comprises a container-shaped electrode 106, a dielectric material 108 within the container-shaped electrode, and another electrode 110 over the dielectric material 108 and within the container-shaped electrode. The electrodes 106 and 110 may comprise any suitable compositions; such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The dielectric material 108 may comprise any suitable composition(s); and in some embodiments may comprise one or more of silicon dioxide, silicon nitride and silicon oxynitride. Although capacitors are specifically illustrated, it is to be understood that the structures 62 may generically refer to any suitable storage elements; including, for example, resistive memory, phase change memory, etc.

Insulative material 112 is provided over and between the capacitors 62. The insulative material 112 may comprise any suitable composition(s); and in some embodiments may comprise one or both of silicon dioxide and silicon nitride.

The semiconductor material 14, shield material 42, insulative material 40, capacitors 62 and insulative material 112 may be together considered to form a subassembly 114.

Referring to FIGS. 4A and 4B, the subassembly 114 is bonded to a handle structure 94 through a bonding region 96, and is then inverted. The handle structure 94 may comprise any suitable configuration, and in some embodiments may correspond to a semiconductor wafer (e.g., a monocrystalline silicon wafer) or other suitable semiconductor substrate. For purposed of interpreting this disclosure, the term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The bonding of the subassembly 114 with the handle structure 94 may be accomplished utilizing any suitable processing; including, for example, techniques in which two silicon dioxide surfaces are placed against one another and subjected to appropriate treatment to induce covalent bonding between the surfaces and thereby form a composite structure. Accordingly, the bonding region 96 may comprise silicon dioxide. The treatment utilized to induce the covalent bonding may be a thermal treatment. Such thermal treatment may utilize a temperature in excess of 800° C. Alternatively, one or both of the silicon dioxide surfaces may be subjected to a plasma treatment prior to the thermal treatment, and then the temperature of the thermal treatment may be reduced to a temperature within a range of from about 150° C. to about 200° C. The bonding of the silicon dioxide surfaces to one another may be referred to as "hybrid bonding" (or "smart-cut"); with example hybrid bonding procedures being described in U.S. Pat. Nos. 9,666,573 and 10,103,053, both of which are assigned to Micron Technology, Inc., and both of which list Mitsunari Sukekawa as an inventor.

The mass 82 (FIG. 3B) of semiconductor material 14 is removed with appropriate processing (e.g., CMP), which exposes regions 98 of the semiconductor material 14 (in some embodiments, the regions 98 may be considered to correspond to bottom regions of the islands 80 of FIG. 3B). Source/drain regions 20 are formed along the regions 98, and in some embodiments may be formed by implanting appropriate dopant into the regions 98. In some embodiments, the source/drain regions 20 and 22 may be referred to as first and second source/drain regions, respectively.

Trenches 116 are formed to extend into the islands 80 (FIG. 3B) and to pattern pillars 48 from the islands. The trenches 116 extend along the x-axis direction (i.e., the first direction, the row direction).

The trenches 116 are lined with gate dielectric material 52, and then wordline material 54 is formed within such lined trenches and patterned into wordlines 58. Subsequently, additional insulative material is formed over the wordlines. In the shown embodiment, the additional insulative material is a same composition as material 52.

The insulative material 52 may be referred to as a second insulative material to distinguish it from the first insulative material 40.

The conductive shield material 42 is patterned into shield plates 43 by the trenches 116.

The embodiment of FIGS. 4A and 4B shows the trenches 116 etched deep enough to reach the doped regions 22. In alternative embodiments, the trenches 116 may be etched less deep, and doped extensions may be formed to extend from bottoms of the trenches to the doped regions 22. For instance, FIGS. 5A and 5B show an embodiment alternative to that of FIGS. 4A and 4B, and show doped extensions 118 formed to extend from bottoms of the trenches 116 to the doped regions 22. The doped extensions 118 may be the same conductivity type as the regions 22, and may be heavily-doped with appropriate dopant. Alternatively, the extensions 118 may be less doped than the regions 22, and may, for example, correspond to lightly-doped diffusion regions.

Figure 6B:
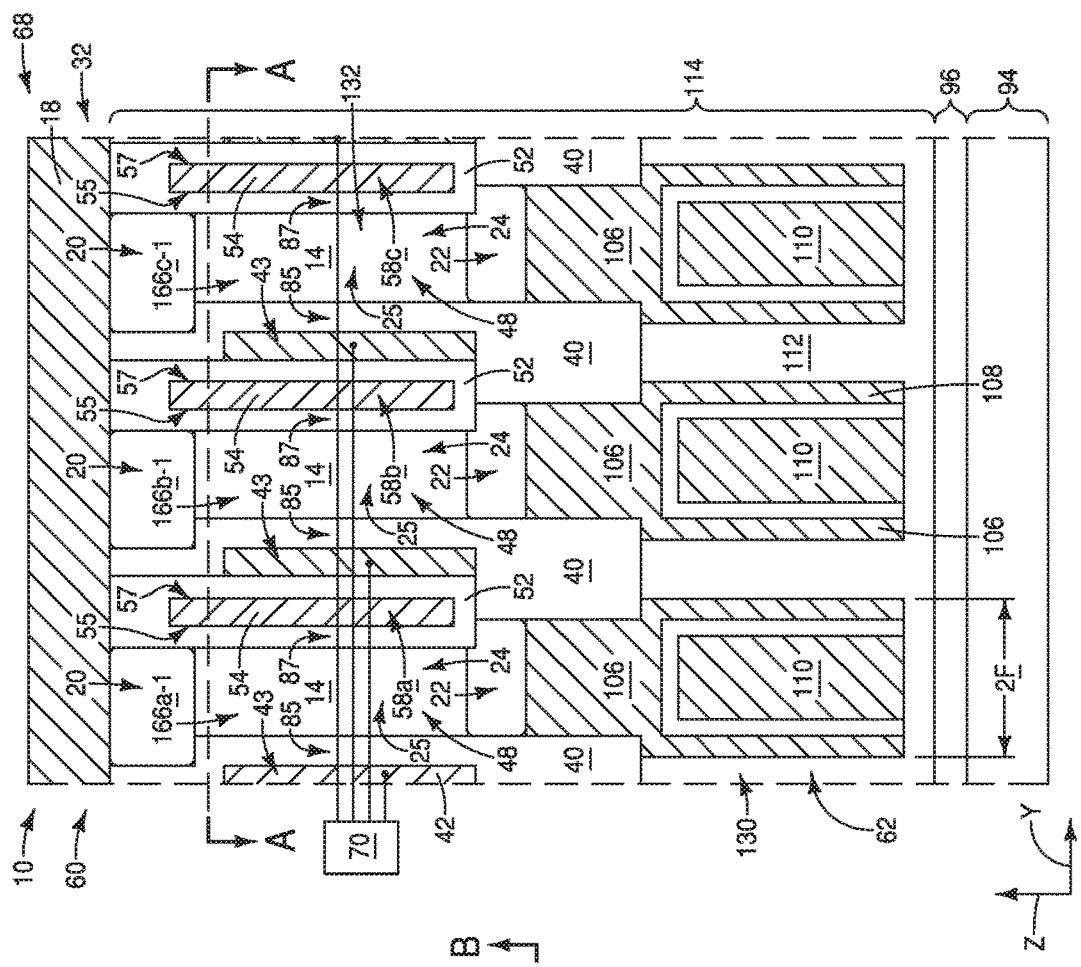
FIGS. 6A and 6B are a diagrammatic cross-sectional top-down view and a diagrammatic cross-sectional side view, respectively, of the example assembly of FIGS. 1A and 1B at an example process stage following that of FIGS. 4A and 4B. The view of FIG. 6A is along the line A-A of FIG. 6B, and the view of FIG. 6B is along the line B-B of FIG. 6A.
Figure 6A:
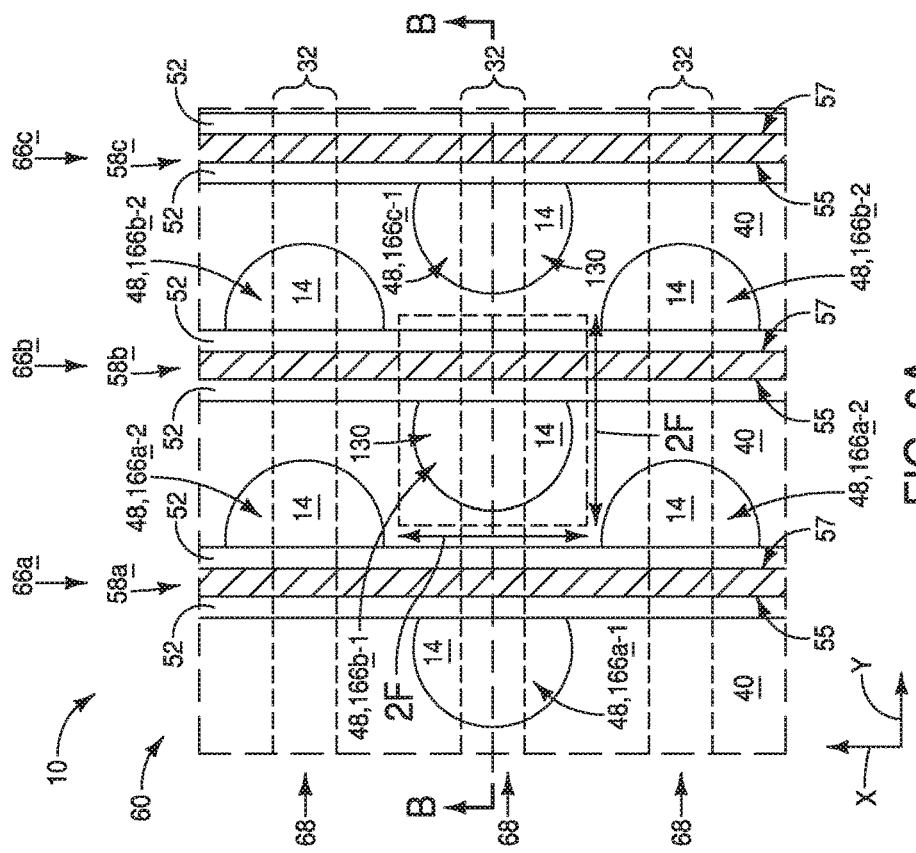

Referring to FIGS. 6A and 6B, the construction 10 is shown at a processing stage subsequent to that of FIGS. 4A and 4B. Bitlines 32 are formed over the subassembly 114, and are coupled with the source/drain regions 20. The bitlines comprise a bitline material 18. The bitline material 18 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some example embodiments the bitline material 18 may comprise one or more of tungsten, titanium, tantalum, tungsten nitride, titanium nitride, tantalum nitride, etc.

The conductive shield plates 43 are coupled with (i.e., electrically connected with) a reference source (i.e., reference voltage node, reference structure, reference terminal, etc.) 70. The reference source is configured to provide a desired voltage to the shield plates 43. Such voltage may be any suitable voltage, and in some embodiments may be a ground voltage (i.e., the shield plates 43 may be electrically grounded).

The shield material 42 may comprise any suitable composition(s); such as metal (e.g., tungsten, titanium, etc.), metal-containing material (e.g., metal silicide, metal nitride, metal carbide, etc.) and/or doped semiconductor material (e.g., doped silicon, doped germanium, etc.). In embodiments in which the conductive shield material comprises doped semiconductor material, the doped regions 20 and 22 may be considered to comprise a first semiconductor material (i.e., material 14), and the conductive shield material 42 may be considered to comprise a second semiconductor material. If the shield material 42 comprises conductively-doped silicon, the shield material may be doped to a same conductivity type as the doped regions 20 and 22, or may be doped to an opposite conductivity type as the doped regions 20 and 22 (with p-type and n-type being understood to be opposite conductivity types).

The construction of FIGS. 6A and 6B may be considered to correspond to an assembly comprising a memory array 60. The memory array includes the bitlines 32 extending along the second direction of the y-axis, (i.e., extending along columns 68 of the memory array 60), and includes the wordlines 58 extending along the first direction of the x-axis (i.e., extending along rows 66 of the memory array). The wordlines 58 are vertically offset from the bitlines 32, and cross the bitlines (specifically, cross under the bitlines relative to the configuration of FIG. 6B).

The pillars 48 are arranged in the rows 66 and the columns 68 of the memory array 60. The pillars 48 along a given column 68 are those pillars coupled with a common bitline 32. The pillars 48 along a given row 66 are those pillars coupled with a common wordline. The wordlines 58 are labeled as 58a, 58b and 58c so that they may be distinguished from another. The rows 66 are labeled as 66a, 66b and 66c so that they may be distinguished from one another, with the row 66a comprising the pillars 48 associated with the wordline 58a, the row 66b comprising the pillars 48 associated with the wordline 58b, and the row 66c comprising the pillars associated with the wordline 58c. The individual pillars 48 are identified relative to a specific one of the rows 66a, 66b and 66c that the pillars are associated with. The pillars associated with the row 66a are labeled 166a, the pillars associated with row 66b are labeled 166b, and the pillars associated with the row 66c are labeled 166c. Notably, each row comprises a first series (i.e., first set) of pillars on one side of a wordline, and a second series (i.e., second set) of pillars on an opposing side of the wordline. For instance, one of the pillars 166a is labeled 166a-1 to show that it is part of a first series on one side of the wordline 58a, and others of the pillars 166a are labeled 166a-2 to show that they are part of a second series on an opposing side of the wordline 58a. The pillars of the first set alternate with the pillars of the second set along the row 66a. Similarly, the pillars 166b comprise a first set 166b-1 and a second set 166b-2, and the pillars 166c comprise a first set 166c-1 and a second set 166c-2 (not shown).

The opposing sides of the wordlines 58 are identified as sides 55 and 57 along the cross-sectional views of FIGS. 6A and 6B. The sides 55 and 57 of the wordlines may be referred to as first and second lateral surfaces of the wordlines.

The first and second source/drain regions 20 and 22 are along the vertically-opposing regions of the semiconductor pillars 48. Each of the semiconductor pillars 48 comprises a channel region (i.e., transistor channel region) 25 vertically disposed between the first and second source/drain regions 20 and 22. The channel regions may be considered to be within body regions 24 of transistors 132, with such body regions extending between the first and second source/drain regions. The wordlines 58 are adjacent to the channel regions, and are spaced from the channel regions by intervening insulative regions comprising the gate dielectric material 52. The gate dielectric material is between the first lateral surface 55 and the channel regions of the semiconductor pillars 48 of the first set (e.g., the pillars 166a-1 along the wordline 58a), and the gate dielectric material is between the second lateral surface 57 and the semiconductor pillars 48 of the second set (e.g., the pillars labeled 166a-2 along the wordline 58a). The conductive shield material 42 is between the semiconductor pillars of the first and second sets.

The embodiment of FIG. 6B shows the gate dielectric material 52 spacing the shield material 42 from the second lateral side 57 of the wordline 58a, and spacing the channel region 25 from the first lateral side 55 of the wordline 58a. In other embodiments, the insulative material spacing the shield material from one lateral side of a wordline may not be the same as the insulative material spacing the transistor channel material from another side of the wordline.

The cross-section of FIG. 6B may be considered to be a cross-section along a column direction (i.e., along the y-axis direction). Such cross-section passes through a series of the first semiconductor pillars (specifically, pillars identified as 166a-1, 166b-1 and 166c-1), and through a series of the conductive plates 43 of the shield material 42. The wordlines (58a, 58b and 58c) along the cross-section have their first lateral surfaces 55 along the channel regions 25 of the semiconductor pillars (i.e., along channel regions of transistors comprising active regions within the semiconductor pillars), and are spaced from such channel regions by the gate dielectric material 52; and have their second lateral surfaces 57 along the conductive plates 43, and spaced from the conductive plates by the gate dielectric material 52. The illustrated shield plates 43 are vertically-extending pillars along the cross-section, with no regions of the shield material extending to under the wordlines 58a-c.

The configuration of FIGS. 6A and 6B may be considered to comprise memory cells 130 comprising the capacitors 62 and the transistors 132. The various features of the memory cells may be patterned with any suitable processing. In some embodiments, at least some of the components described herein may be patterned utilizing lithographically-patterned masking material (e.g., photolithographically-patterned photoresist). The lithographic (e.g., photolithographic) process will have a minimum feature size "F" associated therewith. A goal of integrated circuit fabrication can be to form components to decreasing dimensions in order to achieve increasing levels of integration. The dimensions of the components may be expressed in terms of the minimum feature size F of the lithographic process utilized during fabrication of the components. Some of the embodiments described herein include memory cells 130 which fit within an area defined as $4F^2$. For instance, FIG. 6A diagrammatically illustrates a box of dimension 2F×2F (i.e., area $4F^2$), and such box contains the entire lateral periphery of a memory cell 130.

In some embodiments, the configuration of FIG. 6B may be considered to comprise first regions 85 between the shield plates 43 and the semiconductor pillars 48, and to comprise second regions 87 between the wordlines 58 and the semiconductor pillars.

The shield plates 43 may advantageously suppress interference (e.g., capacitive coupling and/or other mechanisms of cross-talk) between neighboring structures within the memory array 60.

Referring to FIGS. 7A and 7B, the first insulative material 40 (FIGS. 6A and 6B) is removed to form voids 83. The illustrated embodiment removes the entirety of the insulative material 40. In other embodiments, only some of the insulative material may be removed. If the entirety of the material 40 is removed, the material 40 is a sacrificial material; and may or may not comprise insulative material.

The material 40 may comprise any material which may be selectively removed at the processing stage of FIGS. 7A and 7B. In some embodiments, the material 40 may comprise low-density silicon nitride (porous silicon nitride), and may be removed with a wet etch utilizing phosphoric acid.

The voids 83 are formed within the first regions 85; and specifically are formed to be between the shield plates 43 and the channel regions 25.

The voids 83 may be considered to be low-dielectric-constant regions between the shield plates 43 and the channel regions 25. The low-dielectric-constant regions may advantageously improve ON-current within the channel regions 25 during operation of the transistors 132 as compared to configurations having higher-dielectric-constant regions between the shield plates 43 and the channel regions 25. In some applications, it is found that the utilization of the voids 83 may improve the ON-current by at least about 10 fold as compared to configurations having higher-dielectric-constant material present in place of such voids.

In the embodiment of FIGS. 1-7, the voids 83 are formed after the bitlines 32 and the storage elements 62. In other embodiments, at least portions of the voids 83 may be formed prior to one or both of the bitlines 32 and the storage elements 62.

In some embodiments, the configuration of FIGS. 7A and 7B may be considered to comprise integrated memory. The integrated memory comprises wordlines 58, shield plates 43, and access devices 132. The access devices comprise the first and second source/drain regions 20 and 22, and comprise the channel regions 25 vertically disposed between the first and second source/drain regions.

The access devices 132 are adjacent the wordlines 58 and the shield plates 43. The insulating regions 85 are intervening between the channel regions 25 and the shield plates 43, and the insulating regions 87 are intervening between the channel regions 25 and portions of the wordlines 58 proximate such channel regions. The cross-section of FIG. 7B may be considered to show each of the channel regions 25 having a side surface 89 proximate a portion of a wordline 58, and another (opposing) side surface 91 proximate a portion of a shield plate 43. The insulating region 85 is along the side surface 91, and the insulating region 87 is along the side surface 89. One of the side surfaces 89 and 91 may be referred to as a first side surface while the other is referred to as a second side surface; and one of the insulative regions 85 and 87 may be referred to as a first insulating region while the other is referred to as a second insulating region.

The insulating regions 85 comprise the voids 83. In the illustrated embodiment, the voids 83 entirely fill the insulating regions 85. In other embodiments, the voids 83 may only partially fill the insulating regions 85.

The insulative material (dielectric material) 52 is within the insulating regions 87. In some embodiments, such insulative material may comprise, consist essentially of, or consist of silicon dioxide.

In some embodiments, the cross-section of FIG. 7B (the cross-section along the column direction corresponding to the y-axis) may be considered to pass through the wordlines 58, through a series of the semiconductor pillars 48, and through a series of the conductive plates 43. The wordlines 58 along the cross-section of FIG. 7B have their first lateral surfaces 55 along the channel regions 25 of the illustrated semiconductor pillars 48, and spaced from such channel regions 25 by the gate dielectric material 52. The wordlines 58 along the cross-section of FIG. 7B have their second lateral surfaces 57 adjacent the conductive plates 43, and spaced from the conductive plates by the gate dielectric material 52. The conductive plates 43 along the cross-section of FIG. 7B are spaced from the transistor channel regions 25 by the intervening insulative regions 85 comprising the voids 83. In the illustrated embodiment of FIG. 7B the voids 83 extends to under the conductive plates 43 and to over the conductive plates 43. In other embodiments, the voids 83 may not extend to over the conductive plates 43, and/or may not extend to under the conductive plates 43.

The embodiment of FIGS. 1-7 shows the capacitors formed over a semiconductor substrate, followed by inverting of the substrate and bonding it to a handle, and then forming the bitlines. In alternative processing, the bitlines may be formed over the semiconductor substrate, followed by inversion of the substrate and forming of the capacitors. An example of such alternative processing is described with reference to FIGS. 8-14.

Figure 8B:
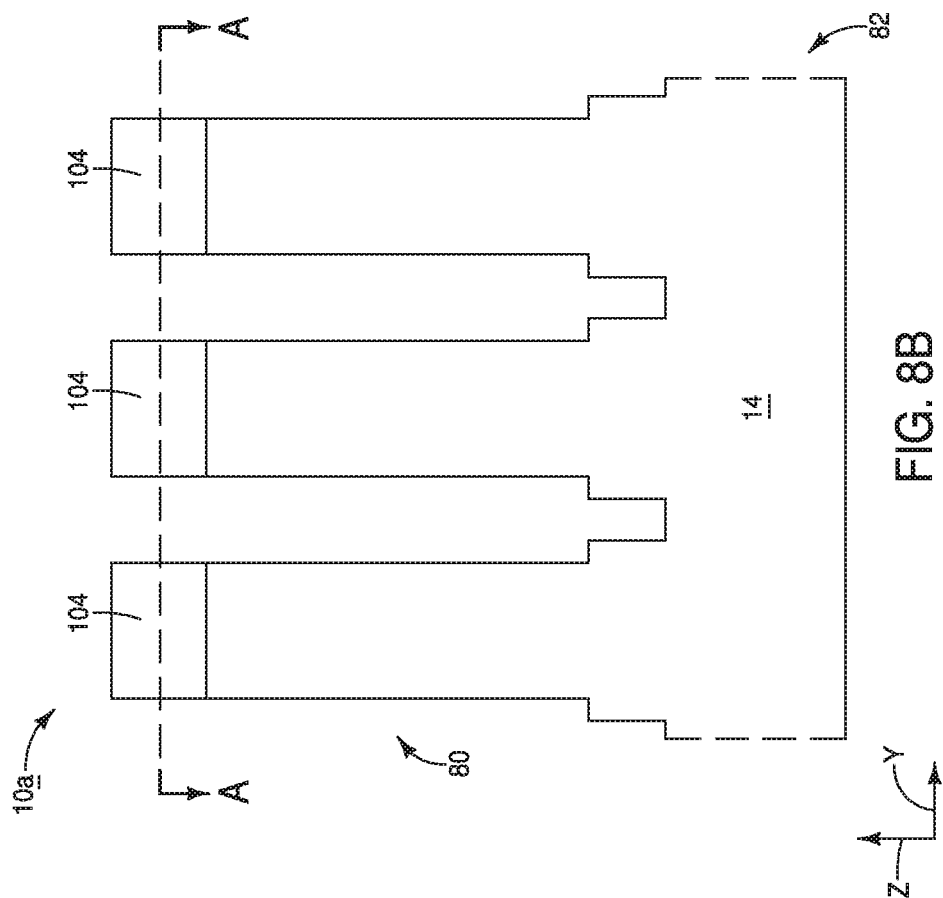
FIGS. 8A and 8B are a diagrammatic cross-sectional top-down view and a diagrammatic cross-sectional side view, respectively, of an example assembly at an example process stage of an example method for fabricating an example array of memory cells. The view of FIG. 8A is along the line A-A of FIG. 8B, and the view of FIG. 8B is along the line B-B of FIG. 8A.
Figure 8A:
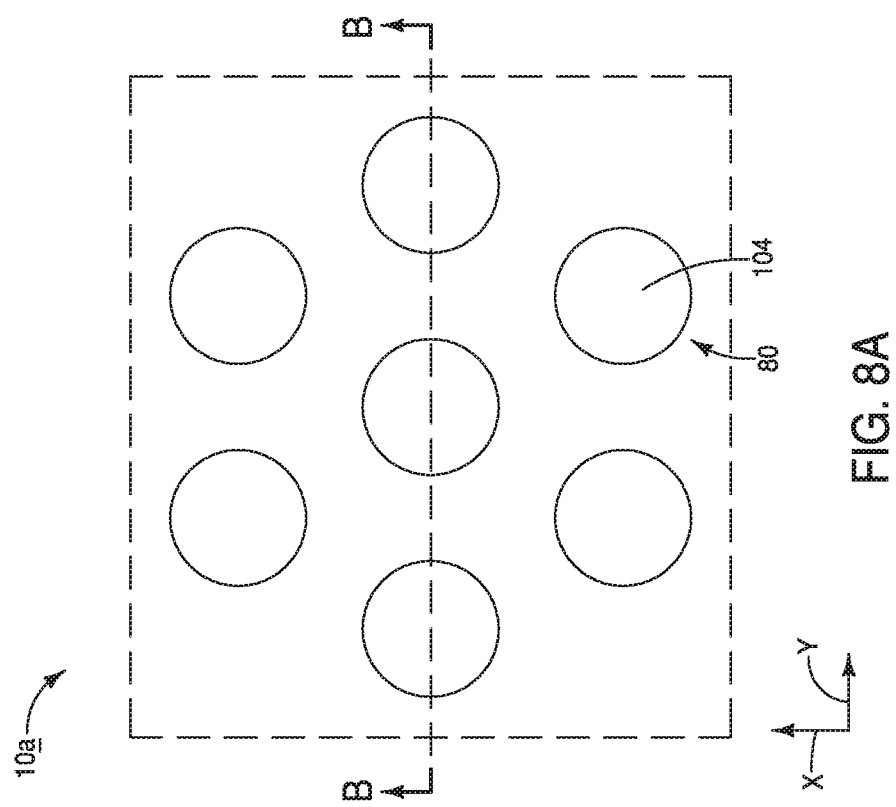

Referring to FIGS. 8A and 8B, a construction 10a comprises the islands 80 of the semiconductor material 14 extending upwardly from the mass 82 of the semiconductor material. The islands are capped with the protective material 104.

Figure 9B:
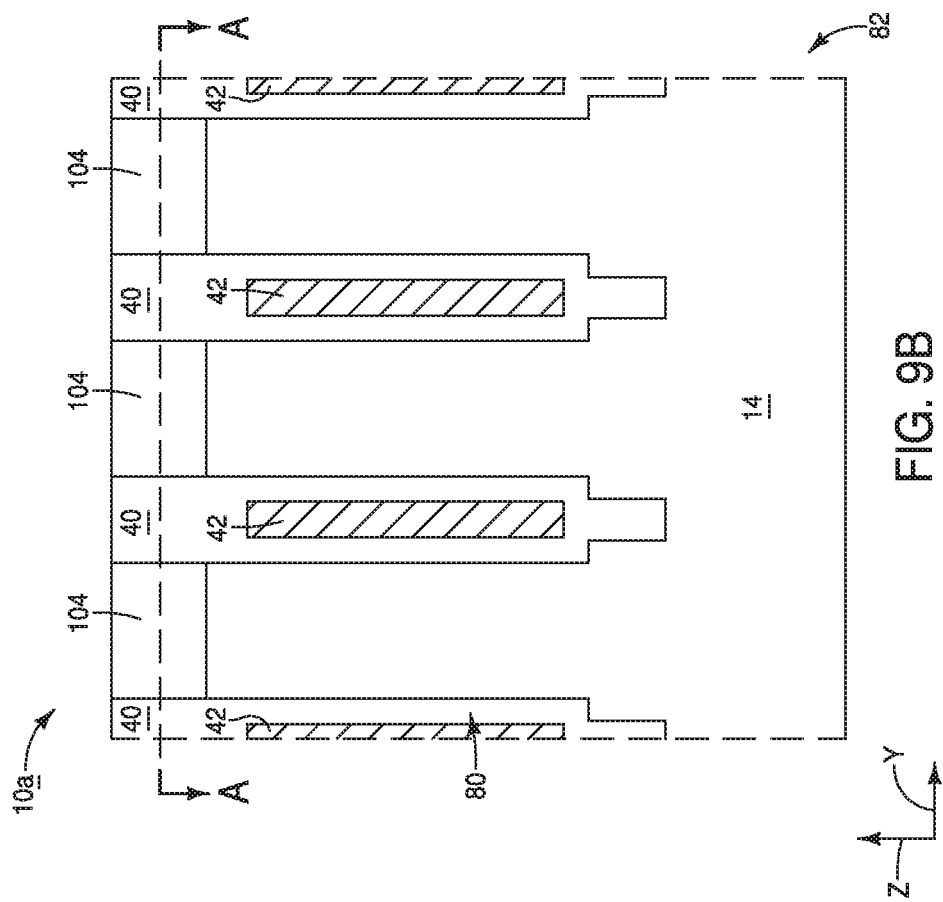
FIGS. 9A and 9B are a diagrammatic cross-sectional top-down view and a diagrammatic cross-sectional side view, respectively, of the example assembly of FIGS. 8A and 8B at an example process stage following that of FIGS. 8A and 8B. The view of FIG. 9A is along the line A-A of FIG. 9B, and the view of FIG. 9B is along the line B-B of FIG. 9A.
Figure 9A:
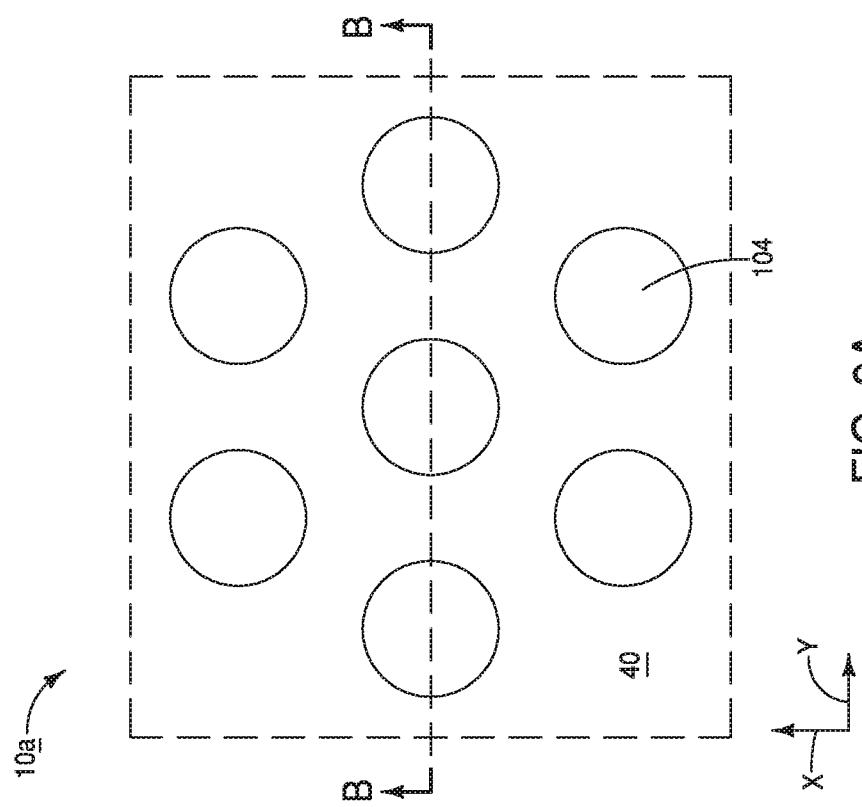

Referring to FIGS. 9A and 9B, regions between the islands 80 are lined with insulative material 40 (first material 40), then shield material 42 is deposited and recessed, and then additional insulative material 40 is provided over the shield material.

Figure 10B:
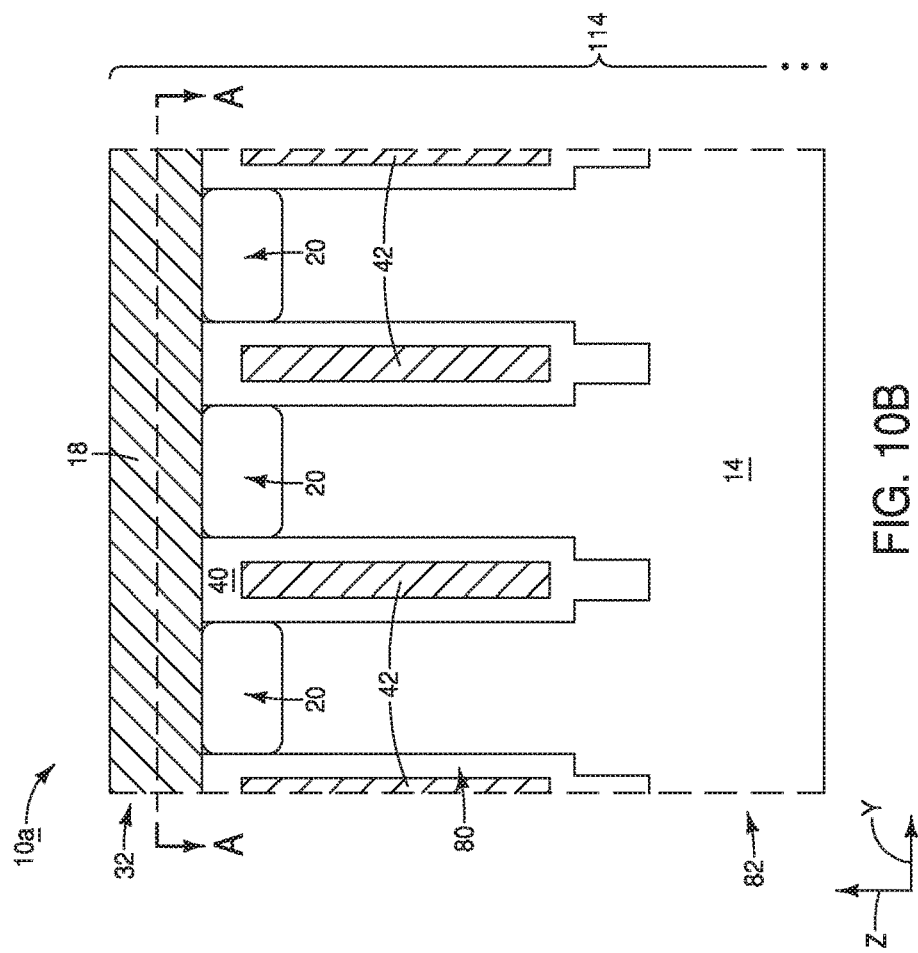
FIGS. 10A and 10B are a diagrammatic cross-sectional top-down view and a diagrammatic cross-sectional side view, respectively, of the example assembly of FIGS. 8A and 8B at an example process stage following that of FIGS. 9A and 9B. The view of FIG. 10A is along the line A-A of FIG. 10B, and the view of FIG. 10B is along the line B-B of FIG. 10A.
Figure 10A:
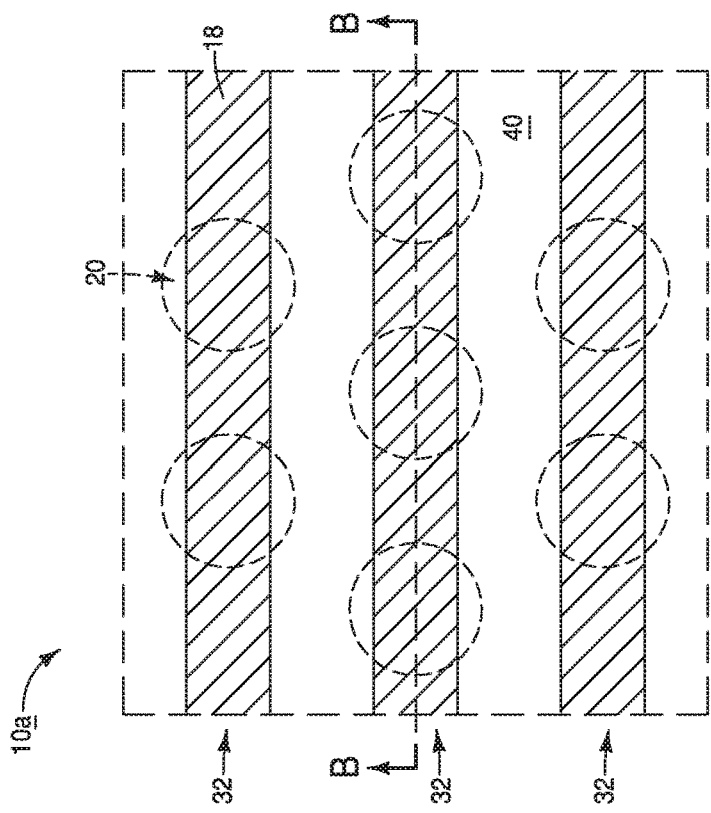

Referring to FIGS. 10A and 10B, the protective material 104 (FIGS. 9A and 9B) is removed, and the doped regions (first source/drain regions) 20 are formed at tops of the semiconductor-material islands 80. Then, the bitlines 32 are formed over the doped regions 20. Portions of the doped regions 20 are shown in the view of FIG. 10A to assist the reader in visualizing the relationship of the bitlines to the regions 20, but are shown in dashed-line (phantom) view to indicate that they are out of the plane of the cross-section of FIG. 10A. The structures of FIGS. 10A and 10B form subassemblies 114 analogous to those described above.

Figure 11B:
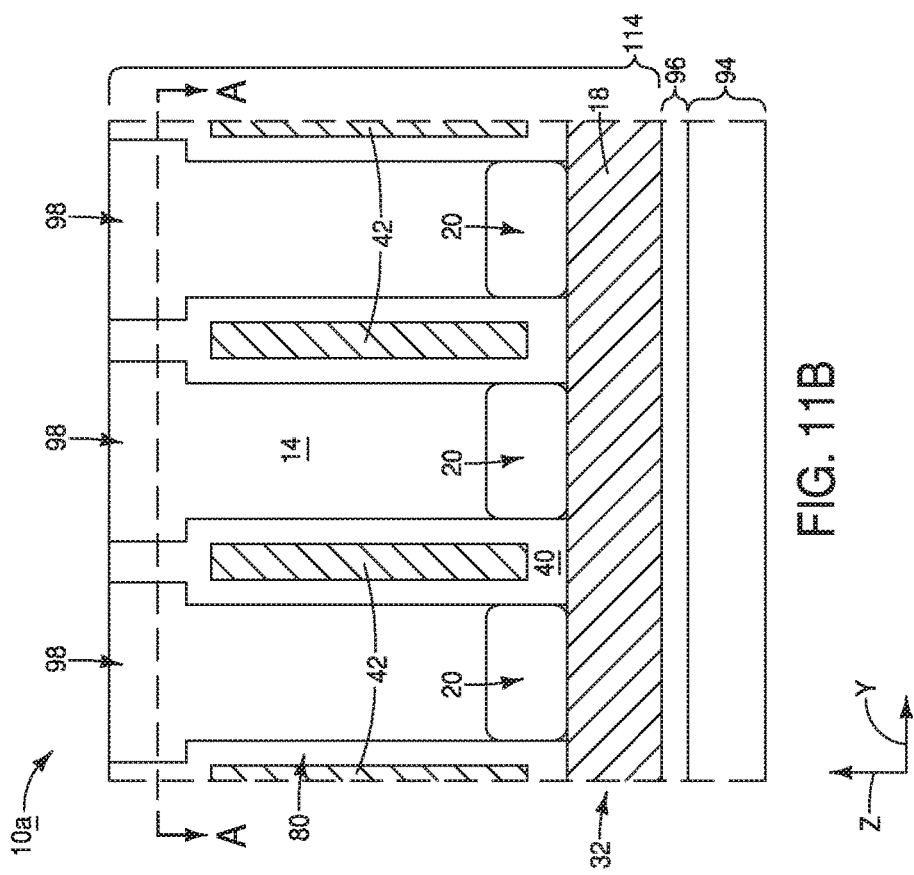
FIGS. 11A and 11B are a diagrammatic cross-sectional top-down view and a diagrammatic cross-sectional side view, respectively, of the example assembly of FIGS. 8A and 8B at an example process stage following that of FIGS. 10A and 10B. The view of FIG. 11A is along the line A-A of FIG. 11B, and the view of FIG. 11B is along the line B-B of FIG. 11A.
Figure 11A:
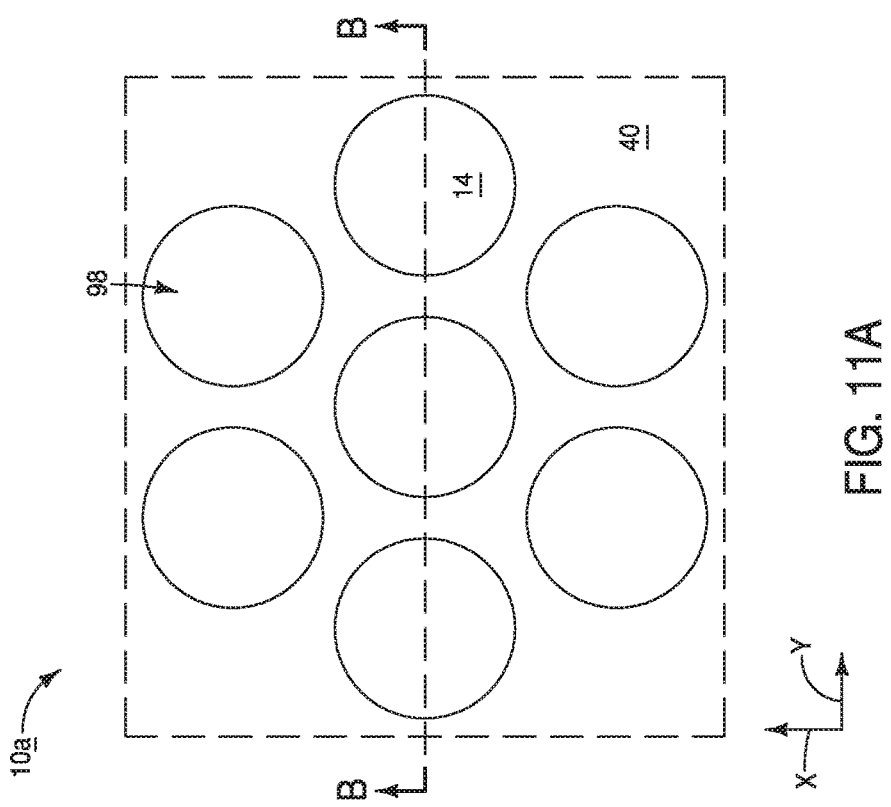

Referring to FIGS. 11A and 11B, the subassembly 114 is bonded to a handle structure 94 and inverted utilizing hybrid bonding analogous to that described above with reference to FIGS. 4A and 4B.

The mass 82 (FIG. 10B) of semiconductor material 14 is removed with appropriate processing (e.g., CMP), which exposes regions 98 of the semiconductor material 14 (in some embodiments, the regions 98 may be considered to correspond to bottom regions of the islands 80).

Figure 12B:
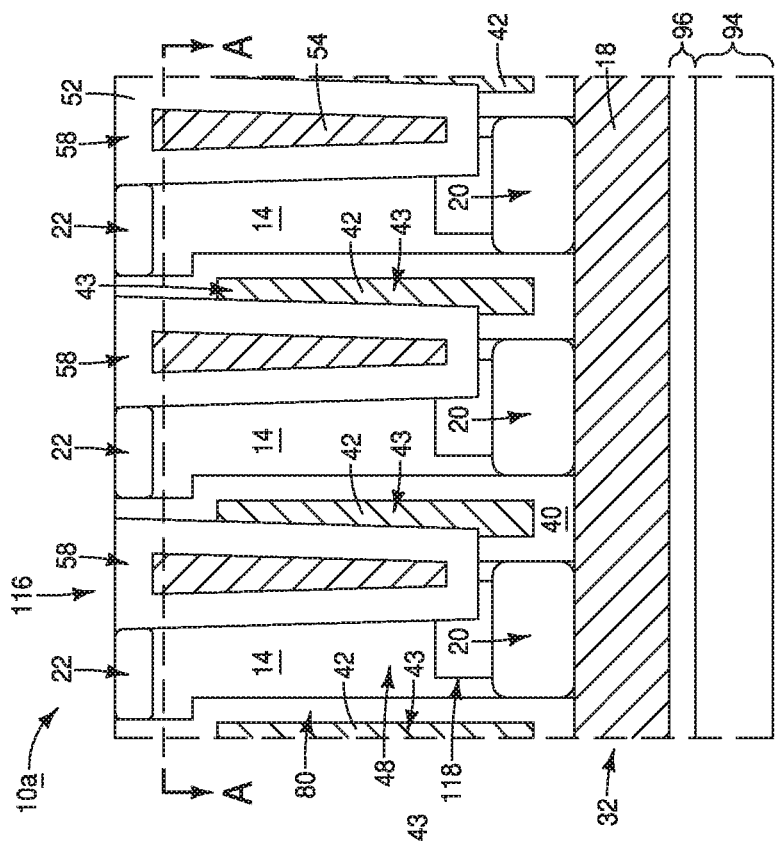
FIGS. 12A and 12B are a diagrammatic cross-sectional top-down view and a diagrammatic cross-sectional side view, respectively, of the example assembly of FIGS. 8A and 8B at an example process stage following that of FIGS. 11A and 11B. The view of FIG. 12A is along the line A-A of FIG. 12B, and the view of FIG. 12B is along the line B-B of FIG. 12A.
Figure 12A:
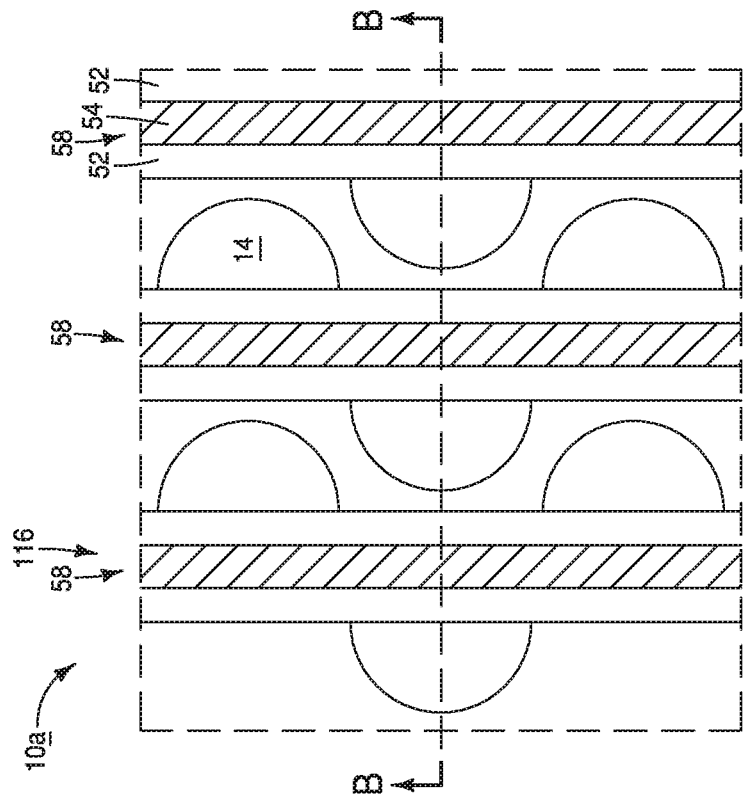

Referring to FIGS. 12A and 12B, the second source/drain regions 22 are formed along upper portions of the semiconductor material 14.

The trenches 116 are formed to extend along the first direction of the x-axis. The trenches 116 pattern the semiconductor material 14 into the pillars 48.

The trenches 116 are lined with the gate dielectric material (the second insulative material) 52, and then the wordline material 54 is formed within such lined trenches and patterned into the wordlines 58. Subsequently, additional insulative material is formed over the wordlines. In the shown embodiment the additional insulative material is a same composition as material 52 (in other embodiments, the additional insulative material may have another composition).

The conductive shield material 42 is patterned into shield plates 43.

In the illustrated embodiment of FIGS. 12A and 12B, the doped extensions 118 are formed to extend from bottoms of the trenches 116 to the doped regions 20.

Figure 13B:
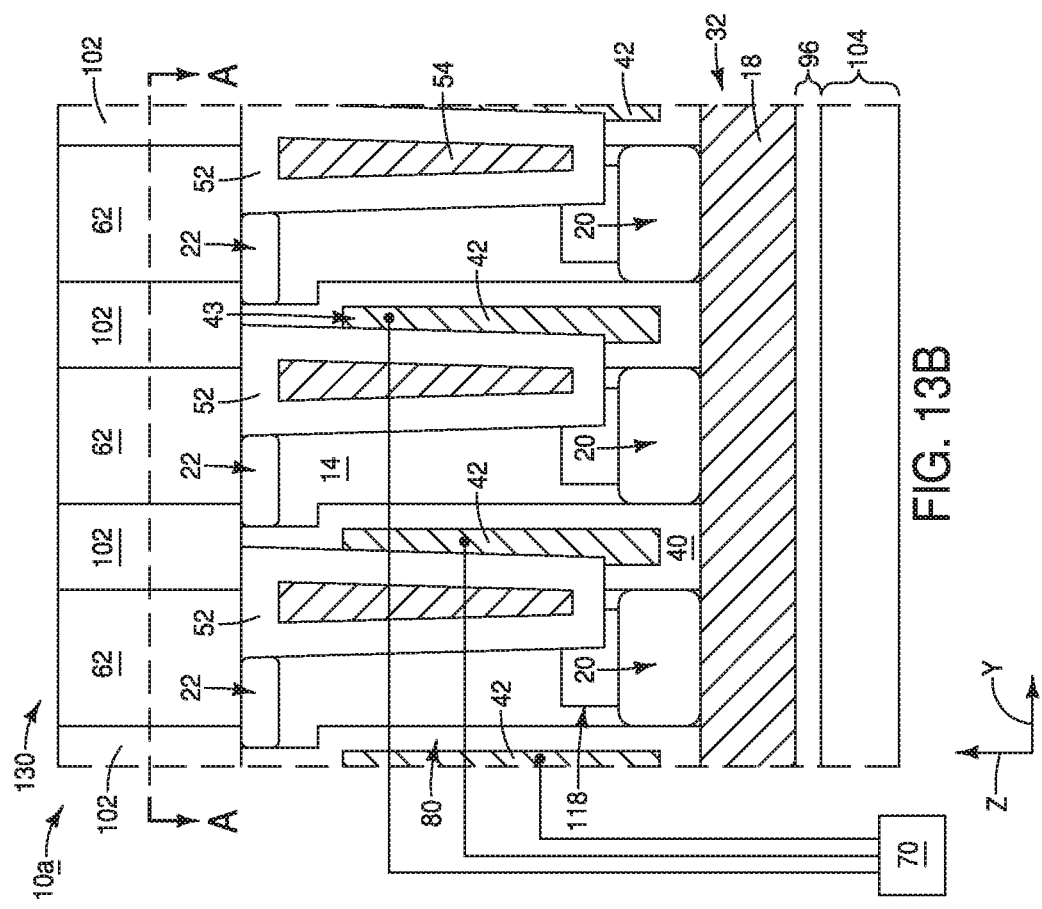
FIGS. 13A and 13B are a diagrammatic cross-sectional top-down view and a diagrammatic cross-sectional side view, respectively, of the example assembly of FIGS. 8A and 8B at an example process stage following that of FIGS. 12A and 12B. The view of FIG. 13A is along the line A-A of FIG. 13B, and the view of FIG. 13B is along the line B-B of FIG. 13A.
Figure 13A:
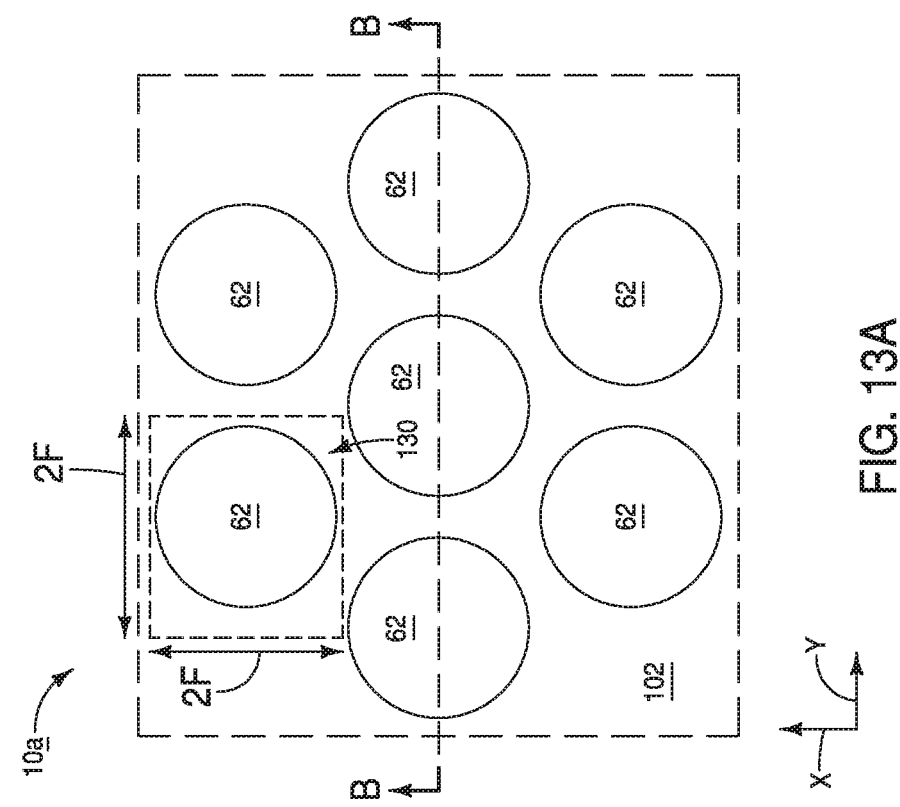

Referring to FIGS. 13A and 13B, capacitors 62 (shown as blocks) are electrically coupled with the source/drain regions 22. Insulative material 102 is provided between the capacitors 62. The shield plates 43 are coupled with the reference voltage 70.

The memory cells 130 of the embodiment of FIGS. 13A and 13B may be configured to have lateral peripheries contained within a $4F^2$ area, as shown relative to FIG. 13A.

Referring to FIGS. 14A and 14B, the first insulative material 40 (FIGS. 13A and 13B) is removed to form the voids 83. The illustrated embodiment removes the entirety of the insulative material 40. In other embodiments, only some of the insulative material may be removed. If the entirety of the material 40 is removed, the material 40 is a sacrificial material; and may or may not comprise insulative material. The material 40 may be removed with processing analogous to that described above with reference to FIGS. 7A and 7B.

The voids 83 are formed within the first regions 85; and specifically are formed to be between the shield plates 43 and the channel regions 25. The insulative material 52 (gate dielectric material) remains within the second regions 87; and specifically remains between the wordlines 58 and the channel regions 25.

The configuration of FIGS. 14A and 14B may be identical to that described above with first to FIGS. 7A and 7B; and is simply shown in an inverted configuration relative to the configuration of FIGS. 7A and 7B.

In some embodiments, the conductive shield material 42 may be formed to directly contact the body regions 24 of the access devices 132. In such embodiments, the shield material 42 may comprise a suitable composition at a suitable reference voltage to enable the shield material to alleviate floating body effects (i.e., charge buildup) that may be associated with the body regions 24 during operation of access devices associated with the memory array 60. For instance, in some embodiments the shield material may comprise doped semiconductor material, with such doped semiconductor material having an opposite-type conductivity relative to the source/drain regions 20 and 22. For instance, if the source/drain regions 20 and 22 are n-type, the shield material may be p-type. The voltage source 70 may be configured to operate together with the shield plates 43 for alleviation of floating body effects within the body regions 24.

An example method for forming the shield material 42 to directly contact the body regions 24 is described with reference to FIGS. 15-17.

Figure 15C:
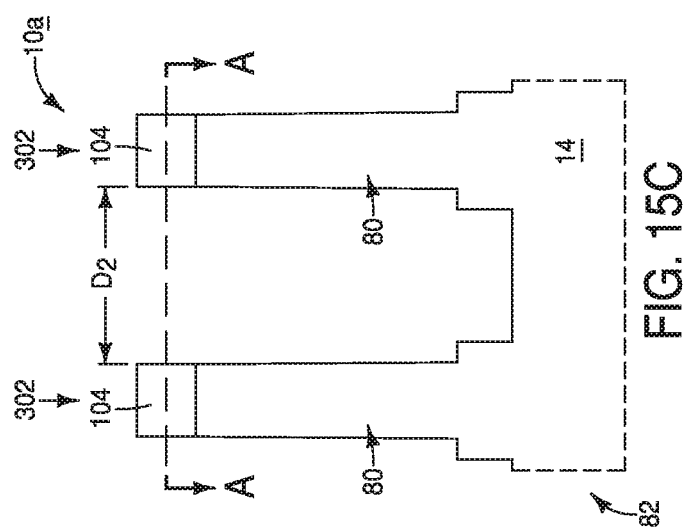
FIGS. 15A, 15B and 15C are a diagrammatic cross-sectional top-down view (FIG. 15A) and diagrammatic cross-sectional side views (FIGS. 15B and 15C) of an example assembly at an example process stage of an example method for fabricating an example array of memory cells. The process stage of FIGS. 15A, 15B and 15C may be utilized as an embodiment of the process shown in FIG. 8. The view of FIG. 15A is along the line A-A of FIGS. 15B and 15C; the view of FIG. 15B is along the line B-B of FIG. 15A; and the view of FIG. 15C is along the line C-C of FIG. 15A.
Figure 15B:
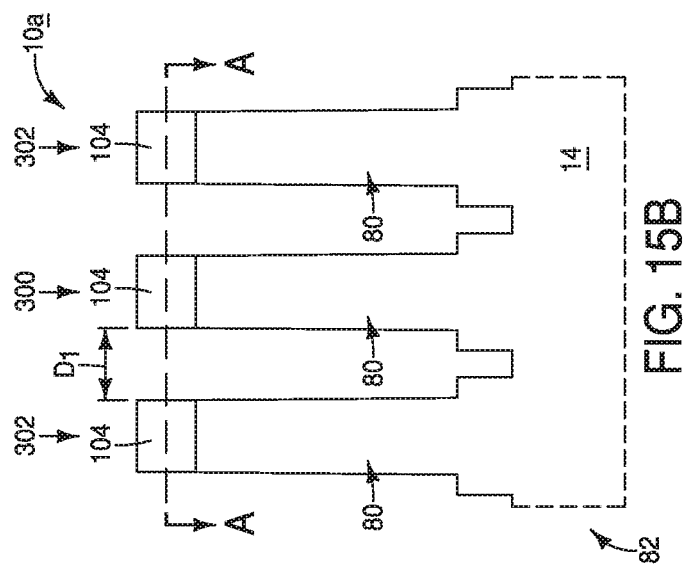
Figure 15A:
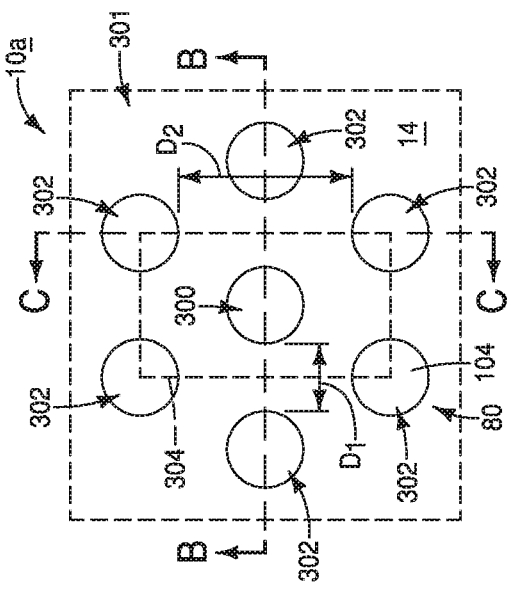

Referring to FIG. 15A-C, the construction 10a is shown at a process stage analogous to that of FIGS. 8A and 8B. The islands 80 within the top view of FIG. 15A may be considered to be assembled in a unit 301 having a central pillar 300, and having six surrounding pillars 302 arranged substantially hexagonally around the central pillar. The term "substantially hexagonally" means hexagonally to within reasonable tolerances of fabrication and measurement. The illustrated unit 301 may be considered to be a repeating unit of a pattern formed across a semiconductor substrate during fabrication of a memory array.

Four of the pillars 302 together define corners of a rectangle 304. The unit 301 has a first dimension $D_1$ from the central pillar 300 to any of the six surrounding pillars 302, and has a second dimension $D_2$ between pillars 302 along the edges of the rectangle 304. The second dimension $D_2$ is larger than the first dimension $D_1$.

Referring to FIGS. 16A-C, the insulative material 40 is formed between the islands 80 (although the material 40 is referred to as being "insulative material", it is to be understood that in some embodiments the material 40 may be sacrificial; and in such embodiments the material 40 may or may not be insulative). In some embodiments, the material 40 may entirely fill regions between the islands 80. The construction 10a is then subjected to directional etching which etches faster along the wider dimension $D_2$ than along the narrower dimension $D_1$. The directional etching removes some of the insulative material 40 from between the islands 80 to form a moat 149 between the islands. The moat has narrow regions 151 between islands spaced by the dimension $D_1$, and has wide regions 153 between islands spaced by the dimension $D_2$. The material 40 remaining after the directional etch lines outer lateral surfaces of the islands 80. The moat 149 does not penetrate the material 40 along the first dimension $D_1$, but does penetrate the material 40 along the second dimension $D_2$ to expose regions 155 of the islands 80 along the second dimension $D_2$. The regions 155 are shown along the cross-sectional side view of FIG. 16C, and are diagrammatically illustrated along the top-down cross-sectional view of FIG. 16A.

Referring to FIG. 17A-17C, the conductive shield material 42 is formed within the moat 149 (FIG. 16A-16C), and then additional insulative material 40 is formed over the shield material 42. The processing stage of FIGS. 17A-17C may be identical to that described above with reference to FIGS. 9A and 9B. The configuration of FIGS. 17A-17C may be subsequently processed with identical processing to that described above with reference to FIGS. 10-14 to form a memory array. However, such memory array will have the shield material 42 of the conductive plates 43 directly contacting body regions 24 of the access devices 132.

Figure 18:
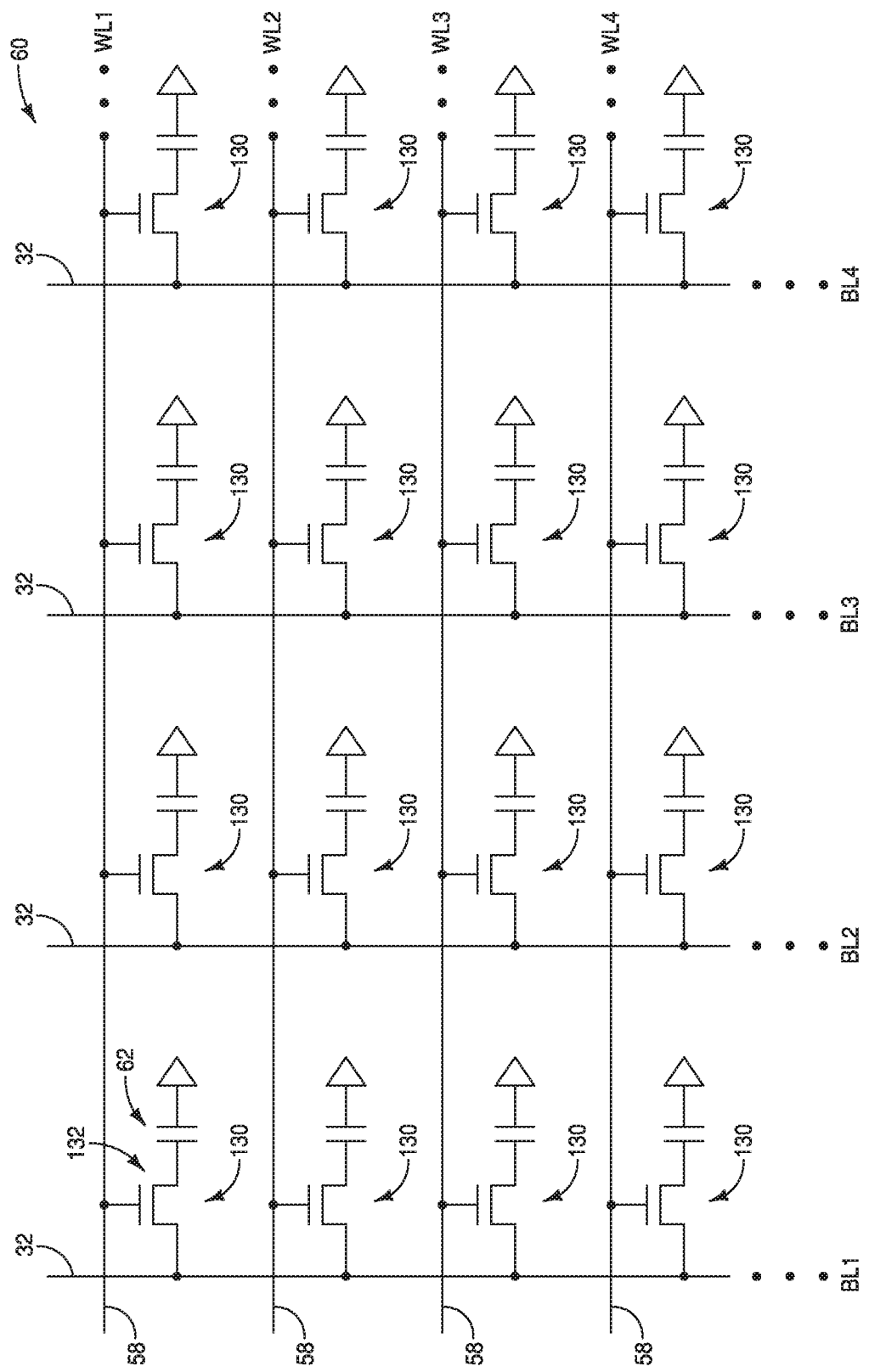
FIG. 18 is a diagrammatic schematic illustration of a region of an example memory array.

The memory arrays 60 described herein may be DRAM arrays, and may comprise memory cells having one transistor in combination with one capacitor (1T-1C memory cells). FIG. 18 schematically illustrates a portion of an example DRAM array 60. The bitlines (digit lines) 32 are shown to correspond to bitlines BL1, BL2, BL3 and BL4; and the wordlines 58 are shown to correspond to wordlines WL1, WL2, WL3 and WL4. Memory cells 130 extend across the array, with each of the memory cells including a capacitor 62 and a transistor (access device) 132. The access devices may comprise active regions within the pillars 48 (described above); with such active regions including the pair of source/drain regions 20 and 22 (described above), and the channel region 25 (described above) between the source/drain regions. Each of the memory cells 130 within the memory array 60 of FIG. 18 is uniquely addressed through a combination of one of the wordlines and one of the bitlines. The memory array may include any suitable number of memory cells; and in some embodiments may comprise hundreds, millions, tens of millions, etc., of memory cells.

Figure 19:
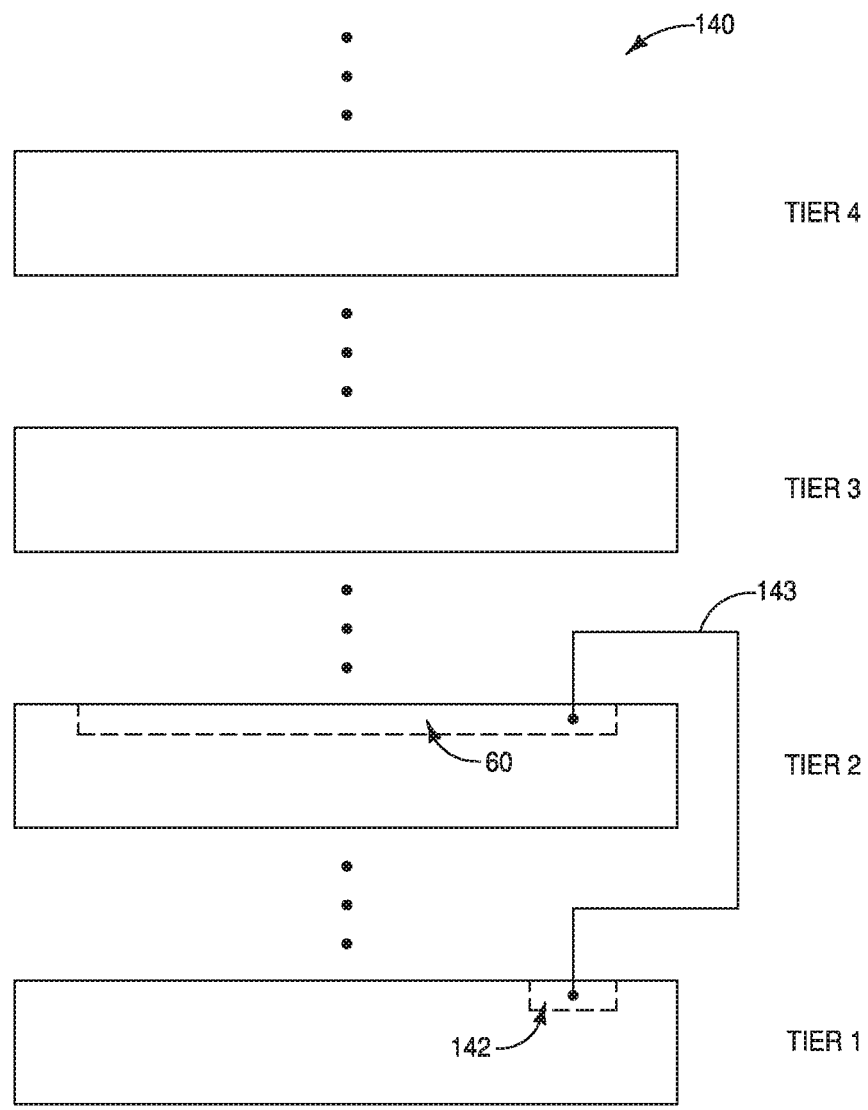
FIG. 19 is a diagrammatic cross-sectional side view of a region of an example assembly comprising stacked tiers.

In some embodiments, a memory array 60 of any of the types described herein may be within a memory tier (i.e., memory deck) which is within a vertically-stacked arrangement of tiers (or decks). For instance, FIG. 19 shows a portion of an integrated assembly 140 comprising a vertically-stacked arrangement of tiers (labeled as tiers 1-4). The vertically-stacked arrangement may extend upwardly to include additional tiers. The tiers 1-4 may be considered to be examples of levels that are stacked one atop the other. The levels may be within different semiconductor dies, or at least two of the levels may be within the same semiconductor die.

The bottom tier (tier 1) may include control circuitry and/or sensing circuitry (e.g., may include wordline drivers, sense amplifiers, etc.); and in some applications may comprise CMOS circuitry (diagrammatically illustrated as CMOS circuitry 142). One or more of the upper tiers (tiers 2-4) may include a memory array, such as, for example, a memory array 60 of any of the types described herein. If multiple tiers comprise memory arrays, the memory arrays within the various tiers may be the same as one another (e.g., may all be DRAM arrays), or may be different relative to one another (e.g., some may be DRAM arrays, while others are NAND arrays). FIG. 19 diagrammatically indicates that a memory array 60 is within the second tier (tier 2), and shows an electrical connection 143 between the CMOS circuitry 142 of tier 1 and components of the memory array 60 of tier 2. In some embodiments, the CMOS circuitry 142 may be electrically coupled with wordlines and/or bitlines of the memory 60; and may comprise, for example, wordline drivers, sense amplifiers, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include integrated memory having a wordline, a shield plate, and an access device. The access device includes first and second diffusion regions and a channel region. The channel region is vertically disposed between the first and second diffusion regions. The access device is adjacent to the wordline and to the shield plate. A part of the wordline is proximate a first side surface of the channel region with an intervention of a first insulating region therebetween. A part of the shield plate is proximate a second side surface of the channel region with an intervention of a second insulating region therebetween. The first insulating region includes an insulative material. The second insulating region includes a void.

Some embodiments include a memory array comprising vertically-extending semiconductor pillars. Each of the semiconductor pillars comprises a transistor channel region vertically disposed between a first source/drain region and a second source/drain region. The semiconductor pillars are arranged in rows and columns of the memory array. The rows extend along a row direction, and the columns extend along a column direction. Wordlines extend along the row direction. The wordlines are adjacent to the transistor channel regions of the semiconductor pillars. Each row of the memory array includes a plurality of the semiconductor pillars along an associated one of the wordlines. Said associated one of the wordlines has a first lateral surface and an opposing second lateral surface. The plurality of semiconductor pillars associated with said one of the wordlines are subdivided amongst a first set along the first lateral surface, and a second set along the second lateral surface. The semiconductor pillars of the first set are spaced from said associated one of the wordlines by a gate dielectric material between the first lateral surface and the transistor channel regions of the semiconductor pillars of the first set. The semiconductor pillars of the second set are spaced from said associated one of the wordlines by the gate dielectric material between the second lateral surface and the transistor channel regions of the semiconductor pillars of the second set. Conductive shield material is between the semiconductor pillars. Bitlines extend along the column direction and are coupled with the first source/drain regions. Storage elements are coupled with the second source/drain regions. Each of the storage elements is uniquely addressed by one of the wordlines in combination with one of the bitlines. A cross-section along the column direction passes through the wordlines, through a series of the first semiconductor pillars, and through a series of conductive plates of the conductive shield material. The wordlines along the cross-section have their first lateral surfaces along the channel regions of the first semiconductor pillars, and are spaced from channel regions of the first semiconductor pillars by the gate dielectric material. The wordlines along the cross-section having their second lateral surfaces spaced from the conductive plates by the gate dielectric material. The conductive plates along the cross-section are spaced from the transistor channel regions of the semiconductor pillars by intervening insulative regions. The intervening insulative regions comprise voids.

Some embodiments include a method of forming an assembly. A construction is formed to have pillars of semiconductor material. The pillars are arranged in rows. The pillars have, along a cross-section, first and second sides in opposing relation to one another. A first insulative material is formed along the first sides of the pillars. Conductive shield material is formed to be adjacent to the first insulative material, and to be spaced from the first sides of the pillars by first regions comprising the first insulative material. A second insulative material is formed along the second sides of the pillars. A wordline material is formed to be adjacent to the second insulative material and to be spaced from the second sides of the pillars by second regions comprising the second insulative material. The wordline material is configured as wordlines extending along a first direction, with the first direction being a direction of the rows. First and second source/drain regions are formed along vertically-opposing regions of the pillars. Each of the pillars comprises a transistor channel region vertically disposed between the first and second source/drain regions associated with the pillar. Bitlines are formed to be electrically connected with the first source/drain regions and to extend along a second direction which crosses the first direction. Storage elements are formed to be electrically connected with the second source/drain regions. At least some of the first insulative material is removed to form voids within the first regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. Integrated memory comprising:
    a wordline;
    a shield plate;
    an access device comprising first and second diffusion regions and a channel region, the first and second diffusion regions and the channel region being arranged vertically so that the channel region is between the first and second diffusion regions;
    wherein the access device is adjacent the wordline and the shield plate so that a part of the wordline is proximate a first side surface of the channel region with an intervention of a first insulating region therebetween and that a part of the shield plate is proximate a second side surface of the channel region with an intervention of a second insulating region therebetween; the first insulating region comprising an insulative material, and the second insulating region comprising a void; and
    wherein the shield plate comprises polycrystalline semiconductive material doped with impurities.
2. The integrated memory of claim 1 wherein the void fills an entirety of the second insulating region.
3. The integrated memory of claim 1 wherein the insulative material comprises silicon dioxide.
4. The integrated memory of claim 1 further comprising:
    a bitline in an electrical connection with first diffusion region; and
    a storage element in an electrical connection with the second diffusion region.
5. The integrated memory of claim 1 wherein the first and second diffusion regions, and the shield plate, are all a same conductivity type.
6. The integrated memory of claim 5 wherein the first and second diffusion regions are n-type, and wherein the shield plate is also n-type.
7. The integrated memory of claim 1 wherein the first and second diffusion regions are a first conductivity type, and wherein the shield plate is a second conductivity type opposite to the first conductivity type.
8. The integrated memory of claim 7 wherein the first and second diffusion regions are n-type, and wherein the shield plate is p-type.
9. The integrated memory of claim 8 wherein the channel region is within a body region of the access device, and wherein the shield plate directly contacts the body region of the access device.
10. The integrated memory of claim 1 wherein the shield plate is coupled with a reference source having ground voltage.
11. The integrated memory of claim 1 comprising a memory cell which includes the access device, and which includes a storage element coupled with one of the first and second source/drain regions.
12. The integrated memory of claim 11 wherein a lateral periphery of the memory cells fits within an area of $4F^2$.
13. The integrated memory of claim 1 wherein the first insulating region is the only structure between the wordline and the first side surface of the channel region.
14. The integrated memory of claim 1 wherein the second insulating region is the only structure between the shield plate and the second side surface of the channel region.
15. The integrated memory of claim 1 wherein the first insulating region is the only structure between the shield plate and the wordline.
16. The integrated memory of claim 1 wherein the wordline and the shield plate are at the same elevation level adjacent the first and second side surfaces, respectively, of the channel region.
17. A memory array, comprising:
    vertically-extending semiconductor pillars; each of the semiconductor pillars comprising a transistor channel region vertically disposed between a first source/drain region and a second source/drain region; the semiconductor pillars being arranged in rows and columns of the memory array; the rows extending along a row direction, and the columns extending along a column direction;
    wordlines extending along the row direction; the wordlines being adjacent the transistor channel regions of the semiconductor pillars; each row of the memory array including a plurality of the semiconductor pillars along an associated one of the wordlines; said associated one of the wordlines having a first lateral surface and an opposing second lateral surface; the plurality of semiconductor pillars associated with said one of the wordlines being subdivided amongst a first set along the first lateral surface, and a second set along the second lateral surface; the semiconductor pillars of the first set being spaced from said associated one of the wordlines by a gate dielectric material between the first lateral surface and the transistor channel regions of the semiconductor pillars of the first set; the semiconductor pillars of the second set being spaced from said associated one of the wordlines by the gate dielectric material between the second lateral surface and the transistor channel regions of the semiconductor pillars of the second set;
    conductive shield material between the semiconductor pillars;

bitlines extending along the column direction and being coupled with the first source/drain regions;

storage elements being coupled with the second source/drain regions; each of the storage elements being uniquely addressed by one of the wordlines in combination with one of the bitlines; and wherein a cross-section along the column direction passes through the wordlines, through a series of the semiconductor pillars, and through a series of conductive plates of the conductive shield material; the wordlines along the cross-section having their first lateral surfaces along the channel regions of the semiconductor pillars, and being spaced from channel regions of the semiconductor pillars by the gate dielectric material; the wordlines along the cross-section having their second lateral surfaces being spaced from the conductive plates by the gate dielectric material; the conductive plates along the cross-section being spaced from the transistor channel regions of the semiconductor pillars by intervening insulative regions; the intervening insulative regions comprising voids.

18. The memory array of claim 17 wherein the voids fill the intervening insulative regions.

19. The memory array of claim 17 wherein the voids extend to under the conductive plates.

20. The memory array of claim 17 wherein the voids extend to over the conductive plates.

21. The memory array of claim 17 wherein the voids extend to under the conductive plates, and to over the conductive plates.

22. The memory array of claim 17 being within a tier; the tier being within a vertically-stacked arrangement of tiers and being over at least one other of the tiers within the vertically-stacked arrangement.

23. The memory array of claim 17 being within a tier; the tier being within a vertically-stacked arrangement of tiers and being over another of the tiers within the vertically-stacked arrangement, said other of the tiers including CMOS circuitry which is electrically coupled with the wordlines and/or the bitlines.

24. The memory array of claim 17 wherein the transistor channel regions are within body regions of the semiconductor pillars, and wherein the conductive shield material directly contacts said body regions.

25. The memory array of claim 17 wherein the intervening insulative regions between the conductive plates and the transistor channel regions is the only structure between the conductive plates and the transistor channel regions.

26. Integrated memory comprising:
a wordline;
a shield plate;
an access device comprising first and second diffusion regions and a channel region, the first and second diffusion regions and the channel region being arranged vertically so that the channel region is between the first and second diffusion regions;
wherein the access device is adjacent the wordline and the shield plate so that a part of the wordline is proximate a first side surface of the channel region with an intervention of a first insulating region therebetween and that a part of the shield plate is proximate a second side surface of the channel region with an intervention of a second insulating region therebetween; the first insulating region comprising an insulative material, and the second insulating region comprising a void; and wherein the first insulating region is the only structure between the wordline and the first side surface of the channel region.

27. Integrated memory comprising:
a wordline;
a shield plate;
an access device comprising first and second diffusion regions and a channel region, the first and second diffusion regions and the channel region being arranged vertically so that the channel region is between the first and second diffusion regions;
wherein the access device is adjacent the wordline and the shield plate so that a part of the wordline is proximate a first side surface of the channel region with an intervention of a first insulating region therebetween and that a part of the shield plate is proximate a second side surface of the channel region with an intervention of a second insulating region therebetween; the first insulating region comprising an insulative material, and the second insulating region comprising a void; and
wherein the second insulating region is the only structure between the shield plate and the second side surface of the channel region.

28. Integrated memory comprising:
a wordline;
a shield plate;
an access device comprising first and second diffusion regions and a channel region, the first and second diffusion regions and the channel region being arranged vertically so that the channel region is between the first and second diffusion regions;
wherein the access device is adjacent the wordline and the shield plate so that a part of the wordline is proximate a first side surface of the channel region with an intervention of a first insulating region therebetween and that a part of the shield plate is proximate a second side surface of the channel region with an intervention of a second insulating region therebetween; the first insulating region comprising an insulative material, and the second insulating region comprising a void; and
wherein the first insulating region is the only structure between the shield plate and the wordline.

29. Integrated memory comprising:
a wordline;
a shield plate;
an access device comprising first and second diffusion regions and a channel region, the first and second diffusion regions and the channel region being arranged vertically so that the channel region is between the first and second diffusion regions;
wherein the access device is adjacent the wordline and the shield plate so that a part of the wordline is proximate a first side surface of the channel region with an intervention of a first insulating region therebetween and that a part of the shield plate is proximate a second side surface of the channel region with an intervention of a second insulating region therebetween; the first insulating region comprising an insulative material, and the second insulating region comprising a void; and
wherein the wordline and the shield plate are at the same elevation level adjacent the first and second side surfaces, respectively, of the channel region.

* * * * *